US010043921B1

(12) United States Patent
Corson et al.

(10) Patent No.: US 10,043,921 B1
(45) Date of Patent: Aug. 7, 2018

(54) PHOTOVOLTAIC CELL WITH HIGH EFFICIENCY CIGS ABSORBER LAYER WITH LOW MINORITY CARRIER LIFETIME AND METHOD OF MAKING THEREOF

(71) Applicant: MiaSole, Santa Clara, CA (US)

(72) Inventors: John Corson, Mountain View, CA (US); Alex Austin, Carmel Valley, CA (US); Robert Tas, Aromas, CA (US); Neil Mackie, Fremont, CA (US); Mats Larsson, Sunnyvale, CA (US); Korhan Demirkan, Santa Clara, CA (US); Weijie Zhang, San Jose, CA (US); Jochen Titus, Sunnyvale, CA (US); Swati Sevanna, Santa Clara, CA (US); Robert Zubeck, Los Altos, CA (US); Randy Dorn, Santa Clara, CA (US); Asit Rairkar, San Jose, CA (US); Ron Rulkens, Milpitas, CA (US); Ajay Saproo, Los Altos, CA (US); Dan Vitkavage, San Jose, CA (US)

(73) Assignee: BEIJING APOLLO DING RONG SOLAR TECHNOLOGY CO., LTD., Beijing (CN)

( * ) Notice: Subject to any disclaimer, the term of this patent is extended or adjusted under 35 U.S.C. 154(b) by 387 days.

(21) Appl. No.: 13/720,238

(22) Filed: Dec. 19, 2012

Related U.S. Application Data

(60) Provisional application No. 61/578,504, filed on Dec. 21, 2011.

(51) Int. Cl.
*H01L 31/032* (2006.01)
*H01L 31/0392* (2006.01)
(Continued)

(52) U.S. Cl.
CPC .. *H01L 31/022425* (2013.01); *H01L 31/0322* (2013.01); *H01L 31/03923* (2013.01); *H01L 31/03928* (2013.01); *H01L 31/0749* (2013.01)

(58) Field of Classification Search
CPC ......... H01L 31/03923; H01L 31/03925; H01L 31/03926; H01L 31/03928; H01L 31/0322;
(Continued)

(56) References Cited

U.S. PATENT DOCUMENTS 2,890,419 A    6/1959   Hagan
4,027,367 A    6/1977   Rondeau
(Continued)

FOREIGN PATENT DOCUMENTS

DE    2757301    7/1979
FR    2820241 A1    8/2002
(Continued)

OTHER PUBLICATIONS

Keyes et al., Influence of Na on the electro-optical properties of CIGS, 1997, 26th PVSC, p. 479-482.*
(Continued)

*Primary Examiner* — James Lin
*Assistant Examiner* — Dujuan A Horton
(74) *Attorney, Agent, or Firm* — The Marbury Law Group PLLC

(57) ABSTRACT

A solar cell containing a plurality of CIGS absorber sublayers has a conversion efficiency of at least 13.4 percent and a minority carrier lifetime below 2 nanoseconds. The sublayers may have a different composition from each other.

17 Claims, 12 Drawing Sheets

(51) Int. Cl.
*H01L 31/0749* (2012.01)
*H01L 31/0224* (2006.01)

(58) Field of Classification Search
CPC . H01L 31/0749; Y02E 10/541; Y02E 10/543;
Y02E 10/544
USPC ....... 136/238, 241, 262, 265, 165, 258, 264,
136/255
See application file for complete search history.

(56) References Cited

U.S. PATENT DOCUMENTS

| | | |
|---|---|---|
| 4,298,444 A | 11/1981 | Chahroudi |
| 4,318,938 A | 3/1982 | Barnett et al. |
| 4,356,073 A | 10/1982 | McKelvey |
| 4,415,427 A | 11/1983 | Hidler et al. |
| 4,465,575 A | 8/1984 | Love et al. |
| 4,818,357 A | 4/1989 | Case et al. |
| 4,915,745 A | 4/1990 | Pollock et al. |
| 5,040,589 A | 8/1991 | Bradley et al. |
| 5,141,564 A | 8/1992 | Chen et al. |
| 5,273,911 A | 12/1993 | Sasaki et al. |
| 5,306,646 A | 4/1994 | Lauf |
| 5,344,500 A | 9/1994 | Sasaki et al. |
| 5,415,927 A | 5/1995 | Hirayama et al. |
| 5,435,965 A | 7/1995 | Mashima et al. |
| 5,480,695 A | 1/1996 | Tenhover et al. |
| 5,522,535 A | 6/1996 | Ivanov et al. |
| 5,522,976 A | 6/1996 | Campet et al. |
| 5,571,749 A | 11/1996 | Matsuda et al. |
| 5,578,503 A | 11/1996 | Karg et al. |
| 5,620,530 A | 4/1997 | Nakayama |
| 5,626,688 A | 5/1997 | Probst et al. |
| 5,728,231 A | 3/1998 | Negami et al. |
| 5,744,252 A | 4/1998 | Rasky et al. |
| 5,814,195 A | 9/1998 | Lehan et al. |
| 5,824,566 A | 10/1998 | Sano et al. |
| 5,904,966 A | 5/1999 | Lippens |
| 5,981,868 A | 11/1999 | Kushiya et al. |
| 5,986,204 A | 11/1999 | Iwasaki et al. |
| 6,020,556 A | 2/2000 | Inaba et al. |
| 6,107,564 A | 8/2000 | Aquilera et al. |
| 6,300,556 B1 | 10/2001 | Yamagishi et al. |
| 6,310,281 B1 | 10/2001 | Wendt et al. |
| 6,365,010 B1 | 4/2002 | Hollars |
| 6,372,538 B1 | 4/2002 | Wendt et al. |
| 6,429,369 B1 | 8/2002 | Tober et al. |
| 6,500,733 B1 | 12/2002 | Stanbery |
| 6,525,264 B2 | 2/2003 | Ouchida et al. |
| 6,559,372 B2 | 5/2003 | Stanbery |
| 6,593,213 B2 | 7/2003 | Stanbery |
| 6,690,041 B2 | 2/2004 | Armstrong et al. |
| 6,736,986 B2 | 5/2004 | Stanbery |
| 6,750,394 B2 | 6/2004 | Yamamoto et al. |
| 6,787,692 B2 | 9/2004 | Wada et al. |
| 6,797,874 B2 | 9/2004 | Stanbery |
| 6,822,158 B2 | 11/2004 | Ouchida et al. |
| 6,852,920 B2 | 2/2005 | Sager et al. |
| 6,878,612 B2 | 4/2005 | Nagao et al. |
| 6,881,647 B2 | 4/2005 | Stanbery |
| 6,936,761 B2 | 8/2005 | Pichler |
| 6,987,071 B1 | 1/2006 | Bollman et al. |
| 7,045,205 B1 | 5/2006 | Sager |
| 7,115,304 B2 | 10/2006 | Roscheisen et al. |
| 7,122,392 B2 | 10/2006 | Morse |
| 7,122,398 B1 | 10/2006 | Pichler |
| 7,141,449 B2 | 11/2006 | Shiozaki |
| 7,148,123 B2 | 12/2006 | Stanbery |
| 7,163,608 B2 | 1/2007 | Stanbery |
| 7,194,197 B1 | 3/2007 | Wendt et al. |
| 7,196,262 B2 | 3/2007 | Gronet |
| 7,227,066 B1 | 6/2007 | Roscheisen et al. |
| 7,235,736 B1 | 6/2007 | Buller et al. |
| 7,247,346 B2 | 7/2007 | Sager et al. |
| 7,253,017 B1 | 8/2007 | Roscheisen et al. |
| 7,259,322 B2 | 8/2007 | Gronet |
| 7,262,392 B1 | 8/2007 | Miller |
| 7,267,724 B2 | 9/2007 | Tanaka et al. |
| 7,271,333 B2 | 9/2007 | Fabick et al. |
| 7,291,782 B2 | 11/2007 | Sager et al. |
| 7,306,823 B2 | 12/2007 | Sager et al. |
| 7,319,190 B2 | 1/2008 | Tuttle |
| 7,374,963 B2 | 5/2008 | Basol |
| 7,544,884 B2 | 6/2009 | Hollars |
| 7,785,921 B1 | 8/2010 | Juliano et al. |
| 7,897,020 B2 | 3/2011 | Mackie et al. |
| 7,935,558 B1 | 5/2011 | Juliano et al. |
| 8,048,707 B1 | 11/2011 | Shufflebotham et al. |
| 8,110,738 B2 | 2/2012 | Schmidt et al. |
| 8,115,095 B2 | 2/2012 | Schmidt et al. |
| 8,134,069 B2 | 3/2012 | Mackie et al. |
| 2004/0144419 A1 | 7/2004 | Fix et al. |
| 2005/0109392 A1 | 5/2005 | Hollars |
| 2006/0096537 A1 | 5/2006 | Tuttle |
| 2006/0096635 A1 | 5/2006 | Tuttle |
| 2006/0219288 A1 | 10/2006 | Tuttle |
| 2007/0062805 A1 | 3/2007 | Mayer et al. |
| 2007/0074969 A1 | 4/2007 | Simpson et al. |
| 2007/0074970 A1 | 4/2007 | Purdy et al. |
| 2007/0269963 A1 | 11/2007 | Cheng et al. |
| 2007/0283996 A1 | 12/2007 | Hachtmann et al. |
| 2007/0283997 A1 | 12/2007 | Hachtmann et al. |
| 2007/0289624 A1 | 12/2007 | Kuriyagawa et al. |
| 2008/0000518 A1 | 1/2008 | Basol |
| 2008/0053519 A1 | 3/2008 | Pearce et al. |
| 2008/0142071 A1 | 6/2008 | Dorn et al. |
| 2008/0169025 A1 | 7/2008 | Basol et al. |
| 2008/0193798 A1 | 8/2008 | Lemon et al. |
| 2008/0271781 A1 | 11/2008 | Kushiya et al. |
| 2008/0283389 A1 | 11/2008 | Aoki |
| 2008/0308147 A1 | 12/2008 | Lu et al. |
| 2008/0314432 A1 | 12/2008 | Paulson et al. |
| 2009/0014049 A1 | 1/2009 | Gur et al. |
| 2009/0014057 A1 | 1/2009 | Croft et al. |
| 2009/0014058 A1 | 1/2009 | Croft et al. |
| 2009/0050208 A1* | 2/2009 | Basol et al. .......... 136/264 |
| 2009/0145746 A1 | 6/2009 | Hollars et al. |
| 2009/0199894 A1 | 8/2009 | Hollars et al. |
| 2009/0223556 A1 | 9/2009 | Niesen et al. |
| 2010/0108503 A1 | 5/2010 | Bartholomeusz et al. |
| 2010/0116341 A1 | 5/2010 | Huang et al. |
| 2010/0133093 A1 | 6/2010 | Mackie et al. |
| 2010/0227066 A1 | 9/2010 | Chung |
| 2010/0258191 A1 | 10/2010 | Mackie et al. |
| 2011/0005587 A1 | 1/2011 | Auvray et al. |
| 2011/0089030 A1 | 4/2011 | Juliano et al. |
| 2012/0090671 A1 | 4/2012 | Shufflebotham et al. |

FOREIGN PATENT DOCUMENTS

| | | |
|---|---|---|
| JP | 11-274534 A | 10/1999 |
| JP | 11-298016 A | 10/1999 |
| JP | 2001-339081 A | 12/2001 |
| JP | 2006-165386 A | 6/2006 |
| KR | 10-0743923 B1 | 7/2007 |
| KR | 10-2008-0064814 | 7/2008 |
| KR | 10-2009-0005324 | 1/2009 |
| KR | 10-2009-0034078 | 4/2009 |
| WO | WO2002/065554 A1 | 8/2002 |

OTHER PUBLICATIONS

Bodegård et al., "The influence of sodium on the grain structure of CuInSo$_2$ films for photovoltaic applications," 12th European Photovoltaic Solar Energy Conference, Proceedings of the International Conference, Amsterdam, The Netherlands, Apr. 11-15, 1994, Hill et al. Ed., vol. II, 1743-1746.

Contreras et al., "On the role of Na and modifications to Cu(In,Ga)Se$_2$ absorber materials using thin-MF (M=Na, K, Cs) precursor layers," 26$^{th}$ IEEE PVSC, Anaheim, California, Sep. 30-Oct. 3, 1997, 359-362.

(56) References Cited

OTHER PUBLICATIONS

Delsol et al., "Experimental Study of Graded Bandgap Cu(InGa)(SeS)2 Thin Films Grown on Glass/Molybdenum Substrates by Selenization and Sulphidation," Solar Energy Materials and Solar Cells, 82 (2004) 587-599.
Devaney et al., "Recent improvement in $CuInSe_2$/ZnCdS thin film solar cell efficiency," 18th IEEE Photovoltaic Spec. Conf., 1985, New York, 1733-1734.
Dullweber et al., "Back Surface Band Gap Gradings in $Cu(In,Ga)Se_2$ Solar Cells," Elsevier, Thin Solid Films, 387, 2001.
Evbuomwan et al., "Concurrent materials and manufacturing process selection in design function deployment," Concurrent Engineering: Research and Applications, Jun. 1995, 3(2):135-144.
Hedström et al., "ZnO/CdS/$Cu(In,Ga)Se_2$ thin film solar cells with improved performance," $23^{rd}$ IEEE Photovoltaic Specialists Conference, Louisville, Kentucky, May 10-14, 1993, 364-371.
Holz et al., "The effect of substrate impurities on the electronic conductivity in CIS thin films," $12^{th}$ European Photovoltaic Solar Energy Conference, Proceedings of the International Conference, Amsterdam, The Netherlands, Apr. 11-15, 1994, Hill et al. Ed., vol. II, 1592-1595.
Granath et al., "Mechanical issues of NO back contracts for $Cu(In,Ga)Se_2$ devices," 13th European Photovoltaic Solar Energy Conference, Proceedings of the International Conference, Nice, France, Oct. 23-27, 1995, Freiesleben et al. Ed., vol. II, 1983-1986.
Lundberg et al., "The Effect of Ga-grading in CIGS Thin Film Solar Cells," Elsevier, Thin Solid Films, 2005, 480-481.
Mickelsen et al., "High photocurrent polycrystalline thin-film CdS/$CuInSe_2$ solar cell," Appl. Phys. Lett., Mar. 1, 1980, 36(5):371-373.
Manaila et al., "Structure of Nitride Film Hard Coatings Prepared by Reactive Magnetron Sputtering," Applied Surface Science, vol. 134, Apr. 1998.
Minami, "New n-type Transparent Conducting Oxides," MRS Bulletin, Aug. 2000.
Mohamed et al., "Correlation between structure, stress and optical properties in direct current sputtered molybdenum oxide films," Thin Solid Films, 2003, 429:135-143.
Probst et al., "The impact of controlled sodium incorporated on rapid thermal processed $Cu(InGa)Se_2$-thin films and devices," First WCPEC, Hawaii, Dec. 5-9, 2004, 144-147.
Ramanath et al., "Properties of 19.2% Efficiency ZnO/CdS/$CuInGaSe_2$ Thin Film Solar Cells," Progress in Photovoltaics: Research and Applications, 2003, 11:225:230.
Rau et al., "$Cu(In,Ga)Se_2$ solar cells," Clean Electricity From Photovoltaics, Series on Photoconversion of Solar Energy, vol. 1, 2001, Archer et al. Ed., Chapter 7, 277-345.
Repins et al., "Measured Minority-Carrier Lifetime and CIGS Device Performance," National Renewable Energy Laboratory, © 2009 IEEE, 978-983.
Rudmann et al., "Effects of NaF Coevaporation on Structural Properties of $Cu(In,Ga)Se_2$ Thin Films," Thin Solid Films, 2003, 431-432:37-40.
Sakurai et al., "Properties of $Cu(In,Ga)Se_2$: Fe Thin Films for Solar Cells," Mater. Res. Soc. Symp. Proc., 2005, 865: F14.12.1-F.14.12.5.
Scofield et al., "Sodium Diffusion, Selenization, and Microstructural Effects Associated with Various Molybdenum Back Contact Layers for Cis-based Solar Cells," Proc. of the 24th IEEE Photovoltaic Specialists Conference, New York, 1995, 164-167.
So et al., "Properties of Reactively Sputtered $Mo_{1-x}O_x$ Films," Appl. Phys. A, 1988, 45:265-270.
Stolt et al., "ZnO/CdS/$CuInSe_2$ thin-film solar cells with improved performance," Appl. Phys. Lett., Feb. 8, 1993, 62(6):597-599.
Topic et al., "Band-gap Engineering in CdS/Cu $(In,Ga)Se_2$ Solar Cells," Journal of Applied Physics, vol. 79, No. 11, Jun. 1996.
Ullal et al., "Current Status of Polycrystalline Thin-Film PV Technologies," National Renewable Energy Laboratory, U.S. Department of Energy, Sep. 1997.
International Search Report & Written Opinion, International Application PCT/US2010/024406, dated Sep. 17, 2010.
International Search Report & Written Opinion, International Application PCT/US2010/030454, dated Nov. 12, 2010.
International Search Report & Written Opinion, International Application PCT/US2010/030456, dated Nov. 17, 2010.
Windischmann, "Intrinsic Stress in Sputter-Deposited Thin Films," Critical Reviews in Solid State and Materials Science, 1992, 17(6): 547-596.
Yun et al., "Fabrication of CIGS Solar Cells with a Na-doped Mo Layer on a Na-free Substrate," Thin Solid Films, 2007, 515:5876-5879.

* cited by examiner

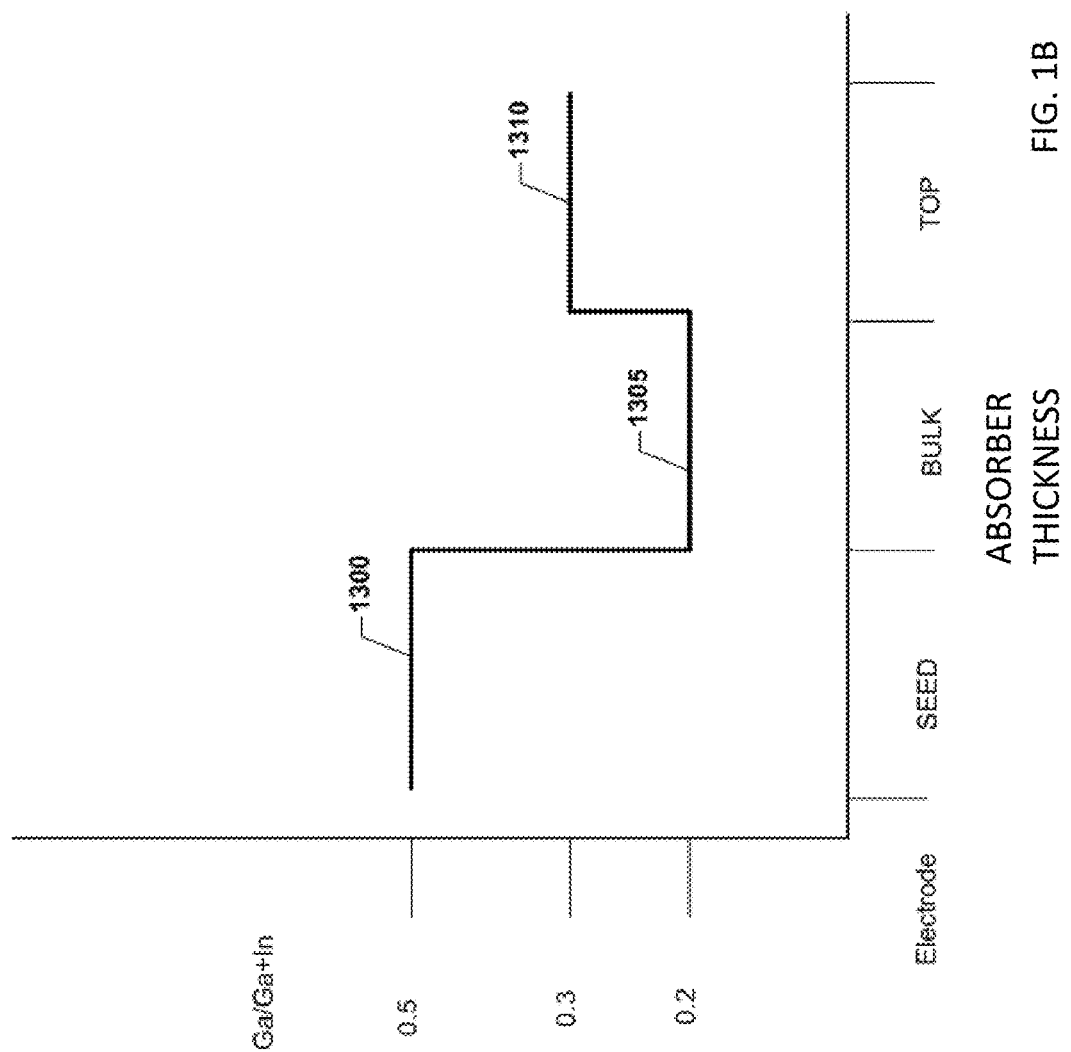

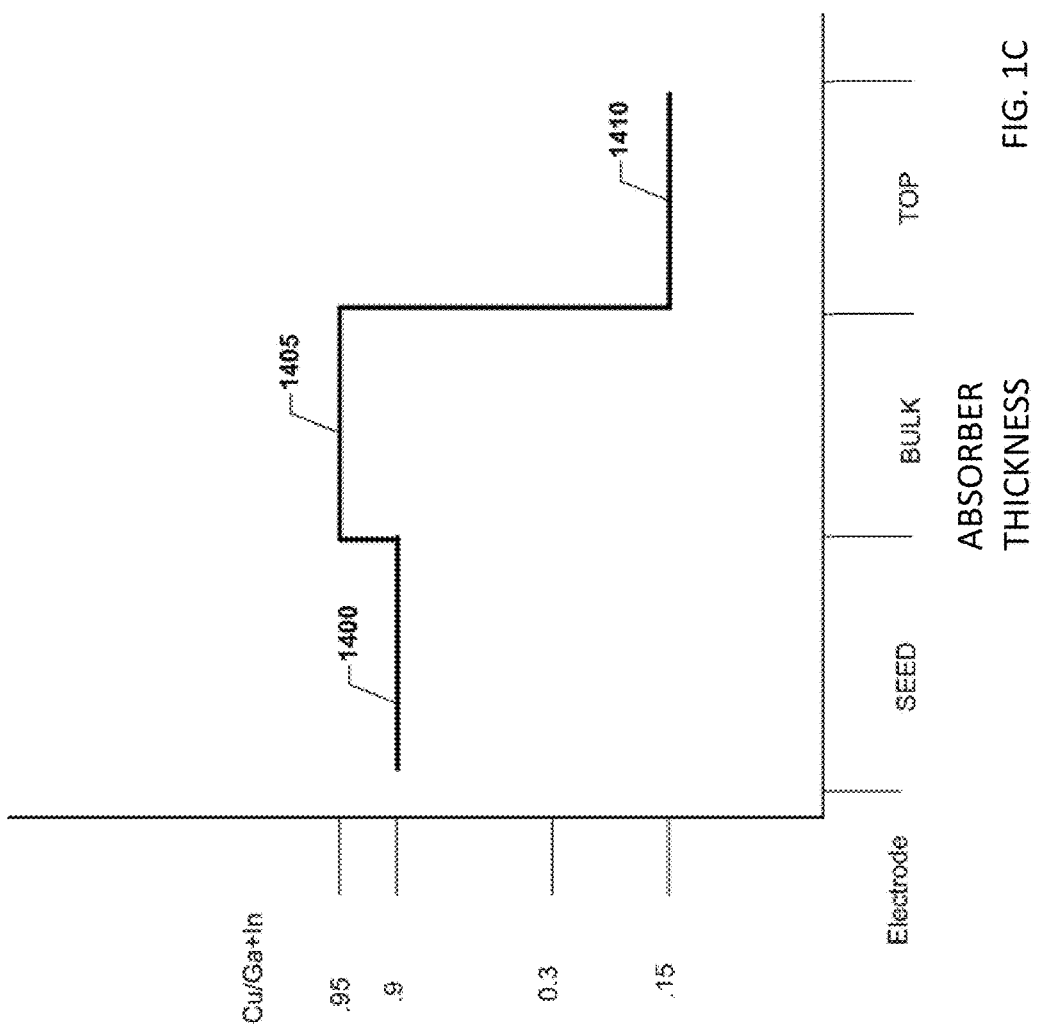

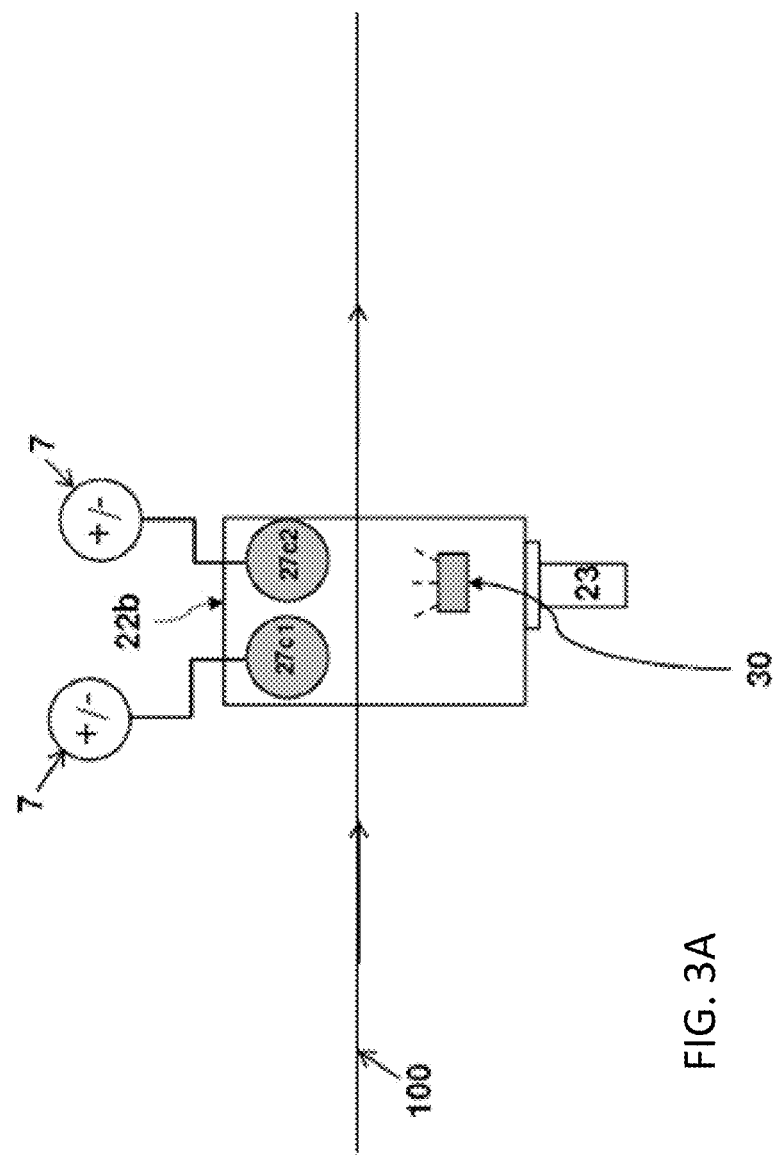

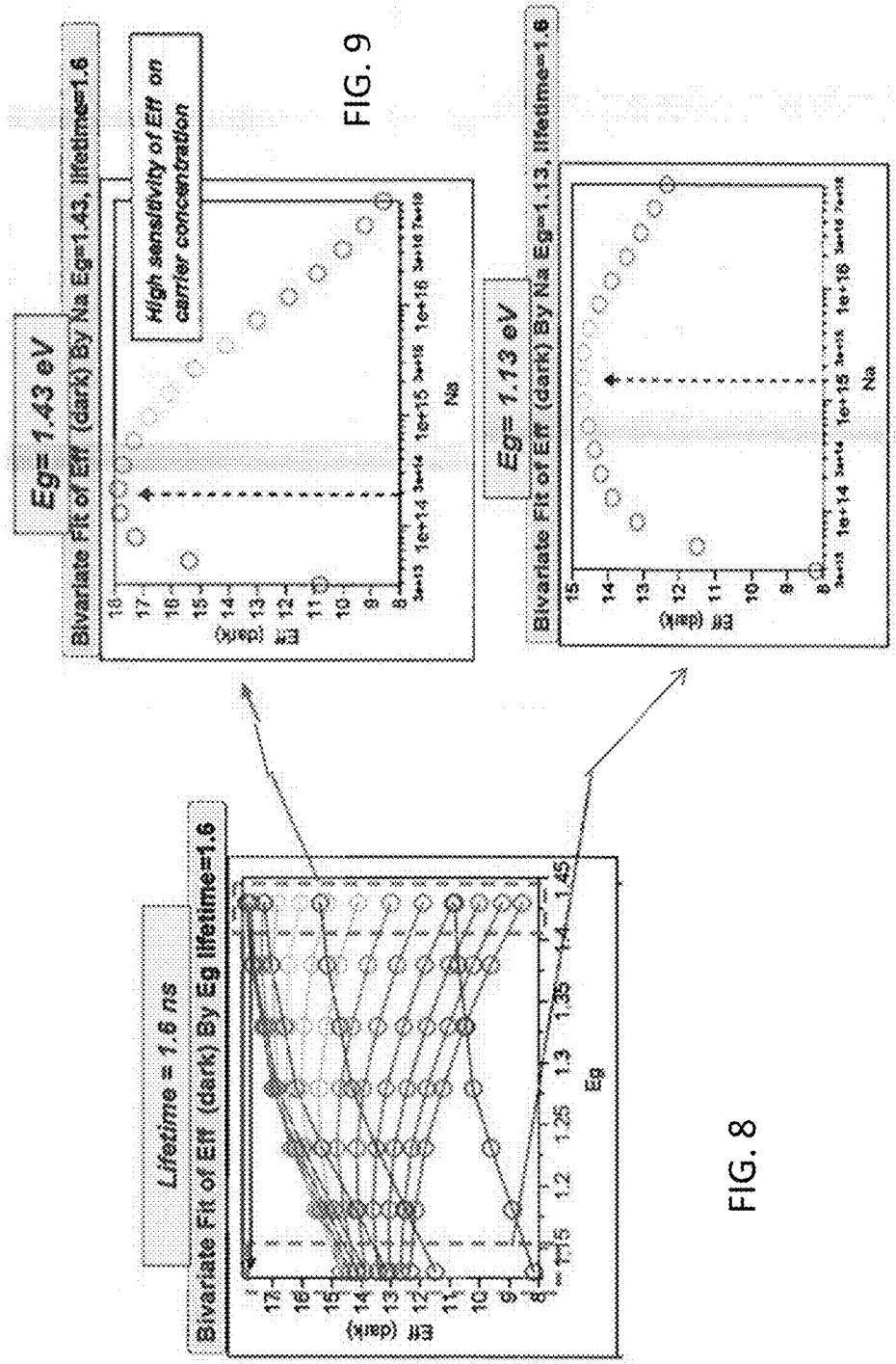

PHOTOVOLTAIC CELL WITH HIGH EFFICIENCY CIGS ABSORBER LAYER WITH LOW MINORITY CARRIER LIFETIME AND METHOD OF MAKING THEREOF

FIELD

The present invention is directed to high efficiency copper-indium-gallium-selenide solar cells. More particularly, the present invention is directed to solar cells that include copper-indium-gallium-selenide material with an extremely short minority carrier lifetime. The present invention is also directed to controlling a selenium to metal ratio in various sublayers of a the p-type semiconductor absorber layer to improve bulk layer adhesion and to increase density.

BACKGROUND

Copper indium diselenide ($CuInSe_2$, or CIS) and its higher band gap variants copper indium gallium diselenide ($Cu(In,Ga)Se_2$, or CIGS), copper indium aluminum diselenide ($Cu(In,Al)Se_2$), copper indium gallium aluminum diselenide ($Cu(In,Ga,Al)Se_2$) and any of these compounds with sulfur replacing some of the selenium represent a group of materials, referred to as copper indium selenide CIS based alloys, have desirable properties for use as the absorber layer in thin-film solar cells. To function as a solar absorber layer, these materials should be p-type semiconductors. This may be accomplished by establishing a slight deficiency in copper, while maintaining a chalcopyrite crystalline structure. In CIGS, gallium usually replaces 20% to 30% of the normal indium content to raise the band gap; however, there are significant and useful variations outside of this range. If gallium is replaced by aluminum, smaller amounts of aluminum are used to achieve the same band gap.

SUMMARY

An embodiment relates to a photovoltaic cell. The solar cell includes a substrate and a first electrode located over the substrate. The solar cell also has at least one copper indium gallium selenide p-type semiconductor absorber layer containing sodium and an n-type semiconductor layer located over the p-type semiconductor layer. The solar cell further includes a second electrode located over the n-type semiconductor layer. The solar cell has a conversion efficiency that is at least 13.4 percent average active area with a minority carrier lifetime below 2 nanoseconds.

Another embodiment relates to a solar cell comprising a substrate and a first electrode located over the substrate. The solar cell has at least one copper indium gallium selenide p-type semiconductor absorber layer containing sodium and an n-type semiconductor layer located over the p-type semiconductor layer. The solar cell includes a second electrode located over the n-type semiconductor layer. The solar cell has a conversion efficiency that is over 13.4 percent average active area with a minority carrier lifetime below 2 nanoseconds. The solar cell also has an open circuit voltage that is greater than 550 mV and the first electrode includes a first transition metal layer which comprises a sodium and oxygen containing molybdenum layer. The sodium diffuses from the first transition metal layer into the p-type semiconductor absorber layer during the step of depositing the p-type semiconductor absorber layer. The p-type semiconductor absorber layer has a band gap of 1.14 eV or higher. The p-type semiconductor absorber layer has a graded composition as a function of thickness and a majority carrier concentration of about $1 \times 10^{13}$ to about $1 \times 10^{15}$ $cm^{-3}$. The graded composition p-type semiconductor absorber layer comprises a first copper indium gallium selenide sublayer adjacent to the first electrode, a second copper indium gallium selenide sublayer over the first sublayer, and a third copper indium gallium selenide sublayer over the second sublayer and adjacent to the n-type semiconductor layer. The first sublayer has a higher ratio of Ga/(Ga+In) than the second sublayer and the third sublayer has a lower ratio of Cu/(Ga+In) than the first or the second sublayers.

Another embodiment relates to a method of manufacturing a solar cell. The method includes providing a substrate and depositing a first electrode over the substrate. The method includes depositing at least one p-type semiconductor absorber layer over the first electrode. The p-type semiconductor absorber layer comprises at least one sodium containing copper indium gallium selenide layer. The method also includes depositing an n-type semiconductor layer over the p-type semiconductor absorber layer and depositing a second electrode over the n-type semiconductor layer. The solar cell has a conversion efficiency of at least 13.4 percent and with a minority carrier lifetime below 2 nanoseconds.

BRIEF DESCRIPTION OF THE DRAWINGS

FIG. 1B illustrates a plot of Ga/(Ga+In) atomic ratio versus absorber thickness.

FIG. 1C illustrates a plot of Cu/(Ga+In) atomic ration versus absorber thickness.

FIG. 3A illustrates a highly simplified schematic diagram of a top view of a sputtering apparatus that can be used for forming a compound semiconductor layer comprising copper, indium, gallium and selenium.

FIG. 8 illustrates a plot of efficiency of a solar cell versus absorber bandgap with a long minority carrier lifetime.

FIGS. 9 and 10 illustrate plots of efficiency versus majority carrier concentration for respective wide and narrow band gap absorber.

DETAILED DESCRIPTION

Figure 1A:
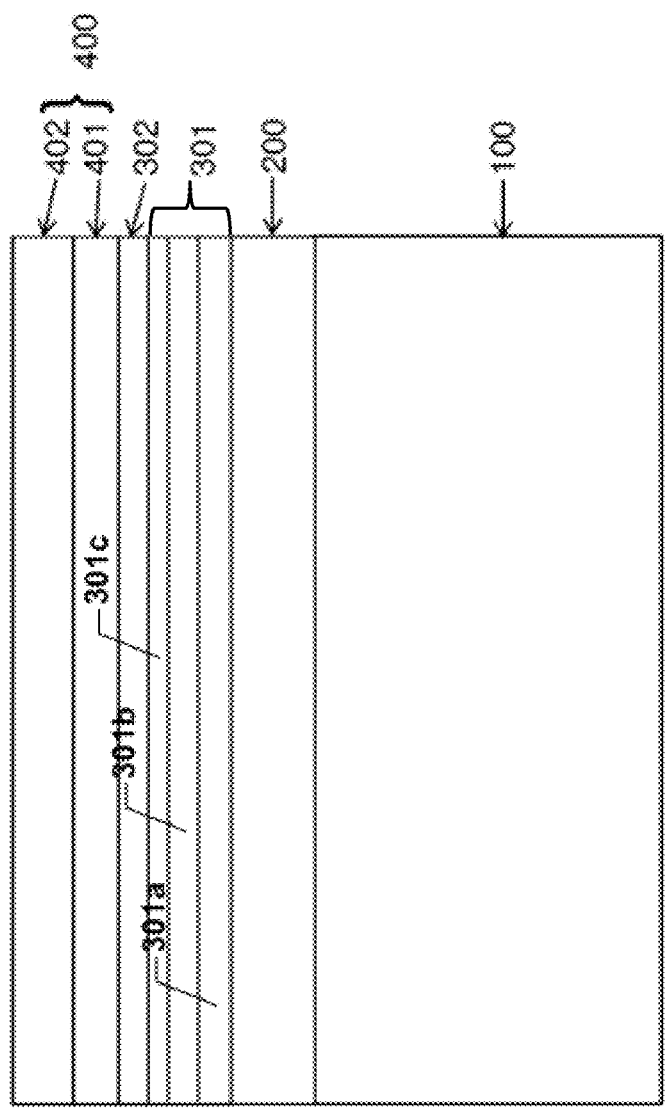
FIGS. 1A and 2 are schematic side cross-sectional views of a CIGS based solar cell according to embodiments of the invention.

As grown copper indium diselenide based films are intrinsically p-type. However, it was found that a small amount of sodium dopants in copper indium diselenide based films (e.g. copper indium gallium diselenide films) increases the p-type conductivity of the copper indium gallium diselenide film and the open circuit voltage, and in turn, improves the efficiency of the solar cell. For example, Ramanathan (Ramanathan et al., Prog. Photovolt. Res. Appl. 11 (2003) 225, incorporated herein by reference in its entirety) teaches that a solar cell, having an efficiency as high as 19.5%, may be obtained by using a soda-lime glass substrate in combination with depositing a copper indium diselenide film under a high growth temperature. This method significantly improves the efficiency of a traditional solar cell by diffusing sodium from the glass substrate into the copper indium diselenide film. However, it is difficult to control the amount of the sodium provided to the copper indium diselenide based film and the speed of the sodium diffusion from a glass substrate. Furthermore, unlike glass substrates, other substrates, such as metal and plastic substrates, do not provide such a readily available supply of sodium.

Rudmann (Rudmann et al., Thin Solid Films 32 (2003) 37) teaches forming a NaF or NaSe layer between the copper indium gallium diselenide layer and a first electrode (also referred as a back electrode). Sodium doping in this system can be controlled by modulating the sodium diffusion from the NaF or NaSe layer into the copper indium gallium diselenide layer. Although the amount of sodium in copper indium gallium diselenide may be more controllable than in the Ramanathan method, the NaF or NaSe interlayer results in a poor adhesion and a greater schottky barrier between the copper indium gallium diselenide layer and the first electrode.

Yun (Yun et al., Thin Solid Films 515(2007) 5876-5879) teaches DC sputtering a sodium-containing molybdenum layer from a composite Na—Mo target. It has been found that resulting solar cells have an improved efficiency because the sodium incorporation enhances the open circuit voltage and fill factor. However, this method is limited by the property of the Na—Mo target, which has a high propensity to crack.

Embodiments of the present invention include a solar cell containing a p-type CIGS absorber layer, where the solar cell that has a conversion efficiency that is at least 13.4, preferably at least 15.7 percent average active area with a minority carrier lifetime that is below 2 nanoseconds. Minority carrier lifetime is defined as the average time between generation and recombination of minority carriers in a semiconductor structure. It is believed that previous p-type CIGS based absorbers for solar cells having a relatively high efficiency of 15 to 16 percent included minority carrier (e.g., electron) lifetimes that are in the 10 to 100 nanosecond range.

High efficiency solar cells having CIGS absorbers of the first embodiment of the invention may have a minority carrier (e.g., electron) lifetime of 0.3 to 0.8 nanoseconds in some embodiments. It is believed that when a minority carrier lifetime is high, such as greater than 15 nanoseconds, an optimal efficiency point does not exist when the CIGS absorber has a wide band gap. In contrast, for solar cells having a CIGS absorber with a low minority carrier lifetime, such as less than two nanoseconds, an optimum efficiency point exits when the absorber was a wide bandgap. This allows the efficiency to be optimized despite a CIGS absorber with a low minority carrier lifetime. The method of the first embodiment includes optimizing the composition, bandgap, deposition temperature and resulting majority carrier concentration of the CIGS absorber layer to optimize the efficiency of the solar cell to be above 13.4, for example 15.7-18.1 percent despite an extremely low minority carrier lifetime of less than 2 nanoseconds.

The high efficiency solar cell includes an open circuit voltage ($V_{oc}$) of greater than 550 mV, such as 650 mV or higher, such as 650 to 660 mV. The solar cell may be placed into a solar module containing a plurality of similar solar cells. The module may have a high conversion efficiency of at least 15.7 percent active average area for the module that has an active area greater than or equal to 1 $m^2$. For example, this module may have a conversion efficiency of 15.7-16.1 percent active average area and a minority carrier lifetime of 1.6 nanoseconds or less, such as 0.3 to 1.6 ns.

In another embodiment, the solar cell may be a standard NREL size cell that has an active area of ¼ $cm^2$ to ½ $cm^2$ and the conversion efficiency may be of at least 14.4, such as 16.6 to 18.1 percent average active area. For example, the solar cell may include a minority carrier lifetime of less than 1 nanosecond, such as 0.3 to 0.8 nanoseconds.

The solar cell of the first embodiment shown in FIG. 1A includes a substrate 100, a first electrode 200 over the substrate 100, at least one p-type CIGS semiconductor absorber layer 301 over the first electrode 200, an n-type semiconductor layer 302 located over the absorber layer 301, and a second transparent electrode 400 located over the n-type semiconductor layer 302.

As shown in FIG. 1A, the CIGS absorber layer 301 contains plural sublayers 301a-301c having a different composition (e.g., different copper, indium and gallium ratios) from each other. The sublayers include a seed sublayer over electrode 200, a middle bulk sublayer and a top sublayer shown as reference numerals 301a, 301b and 301c, respectively. The seed sublayer 301a may include a higher atomic ratio of Ga/(Ga+In) than the bulk sublayer 301b. The top sublayer 301c may include a lower atomic ratio of Cu/(Ga+In) than the seed or the bulk sublayers 301a, 301b. These metal ratio differences between the sublayers enhance the adhesion of the absorber 301 to the underlying electrode 200 while increasing the efficiency of the solar cell.

In one non-limiting example, the seed sublayer 301a has a ratio of Ga/(Ga+In) of greater or equal to 0.4. The bulk sublayer 301b has a ratio of Ga/(Ga+In) of less than or equal to 0.3. Specifically, the seed sublayer 301a may include a ratio of Ga/(Ga+In) of 0.4 to 0.6, and may include a ratio of Cu/(Ga+In) of 0.75 to 0.9. The bulk sublayer 301b may include a ratio of Ga/(Ga+In) of 0.2 to 0.3, and a ratio of Cu/(Ga+In) of 0.85 to 0.99, such as 0.9 to 0.99. The top sublayer 301c may include a ratio of Ga/(Ga+In) of 0.25 to 0.35, and a ratio of Cu/(Ga+In) of 0.05 to 0.3.

FIG. 1B illustrates a schematic plot of Ga/(Ga+In) atomic ratio as a function of thickness through the p-type CIGS semiconductor absorber layer 301. The Ga/(Ga+In) ratio is illustrated on the y-axis and layer 301 thickness on the x-axis. Shown by reference numeral 1300, the Ga/(Ga+In) ratio is about 0.5 in the seed sublayer 301a adjacent to the bottom electrode 200. The seed sublayer 301a may be about 0.2 to 0.3 microns thick. The Ga/(Ga+In) ratio is reduced from about 0.5 to about 0.2 in the middle bulk sublayer 301b as shown by reference numeral 1305. The bulk sublayer 301b may be about 1 to 2 microns thick. The Ga/(Ga+In) ratio increases from about 0.2 to about 0.3 in the top or surface sublayer 301c shown by reference numeral 1310. The top sublayer may be about 0.15 to 0.2 microns thick. The entire CIGS layer 301c may be about 1.3 to 2.5 microns thick. Thus, the seed sublayer 301a is the most gallium rich sublayer, and the bulk sublayer 301b is the most gallium poor sublayer of layer 301.

FIG. 1C illustrates a plot of Cu/(Ga+In) atomic ratio as a function of thickness through the p-type CIGS semiconductor absorber layer 301. Shown by reference numeral 1400, the Cu/(Ga+In) ratio is about 0.8-0.9 in the seed sublayer 301a. The Cu/(Ga+In) ratio increases slightly from about 0.8-0.9 to about 0.95 in the bulk sublayer 301b as shown by reference numeral 1405. The Cu/(Ga+In) ratio decreases from about 0.95 to about 0.15 in the top sublayer 301c as shown by reference numeral 1410. Thus, the bulk sublayer 301b is the most copper rich sublayer, and the top sublayer 301c is the most copper poor sublayer of layer 301. The top sublayer 301c is comprised mostly of indium selenide with a small amount of gallium and a very small amount of copper.

CIGS layer 301 may include a sodium concentration of $10^{19}$ to $10^{21}$ cm$^{-3}$ and a bandgap of 1.14 eV or higher, such as 1.3 eV to 1.5 eV, at least in the bulk sublayer 301b. Preferably, the p-type CIGS absorber layer 301 has a majority (e.g., hole) carrier concentration of about $1\times10^{13}$ to about $1\times10^{15}$ cm$^{-3}$. Preferably, layer 301 is slightly copper deficient and has a slightly less than one copper atom (e.g., 0.8 to 0.99 copper atoms) for each one of Group III atom and each two of Group VI atoms, at least in the bulk sublayer 301b, as described above.

Figure 2:
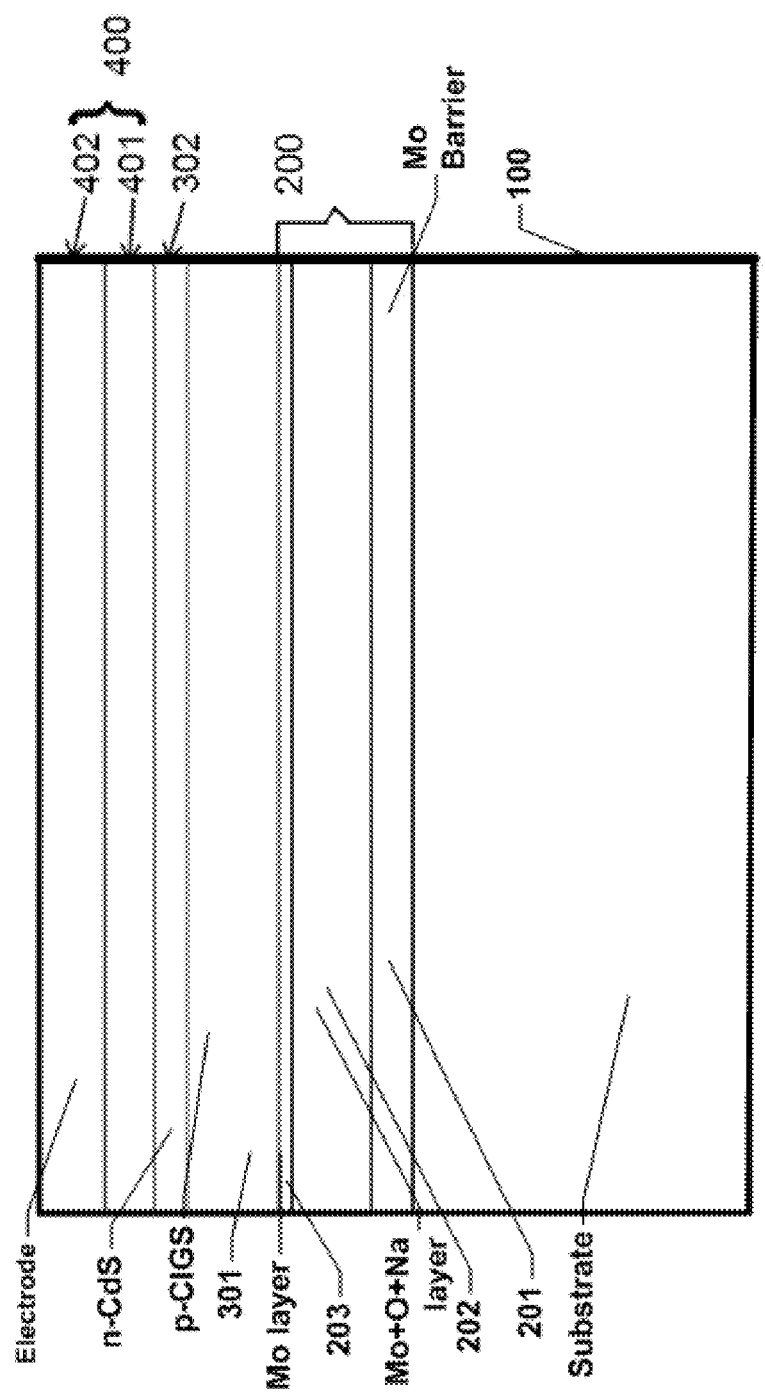

The first (lower) electrode 200 may comprise a transition metal, for example, one of Mo, W, Ta, V, Ti, Nb, Zr, or alloys thereof. Optionally, as shown in FIG. 2, the first electrode 200 of the solar cell may comprise an alkali diffusion barrier layer 201 located between the substrate 100 and a first sodium containing transition metal layer 202, and a second transition metal barrier or adhesion layer 203 located over the first sodium containing transition metal layer 202. Additional barrier and/or adhesion layers (not shown), such as Cr and/or metal nitride layers may be further disposed between the electrode 200 and the substrate 100, for example between the optional alkali diffusion barrier layer 201 and the substrate 100.

In one embodiment, the first transition metal layer 202 may be a molybdenum layer containing sodium and a lattice distortion element or a lattice distortion compound. In some embodiments, the lattice distortion element or the lattice distortion compound has a crystal structure different from that of the first transition metal layer 202 to distort a polycrystalline lattice of the first transition metal layer 202. In some embodiments, when the transition metal 202 is molybdenum, the lattice distortion element may be oxygen, forming the first transition metal layer of body centered cubic Mo lattice distorted by face centered cubic oxide compositions, such as MoO$_2$ and MoO$_3$ (e.g., MoO$_x$ type lattice distortion compounds). The first transition metal layer 202 may include at least 59 atomic percent molybdenum, 5 to 40 atomic percent oxygen, and 0.01 to 1.5 atomic percent sodium.

The optional alkali diffusion barrier layer 201 and second transition metal barrier/adhesion layer 203 may comprise any suitable materials. For example, they may be independently selected from a group consisting Mo, W, Ta, V, Ti, Nb, Zr, Cr, TiN, ZrN, TaN, VN, V$_2$N or combinations thereof. Layers 201, 202 and 203 may comprise the same or different metals from each other. Preferably, layers 201, 202 and 203 contain at least 50 atomic percent molybdenum. Layers 201 and 203 may comprise pure molybdenum with unavoidable impurities. While the alkali diffusion barrier layer 201 and the second transition metal barrier layer 203 may be substantially oxygen free, the first transition metal layer 202 preferably contains oxygen and is deposited at a higher pressure than the barrier layers 201, 203 to achieve a lower density than the barrier layers 201, 203.

Barrier layer 201 is preferably denser than barrier/adhesion layer 203, such that layer 201 prevents alkali diffusion into the substrate 10 while layer 203 allows controlled alkali diffusion into the absorber layer 301 based on layer 203 thickness, composition and/or density. If desired, layer 203 may include some oxygen, such as 1 to 10 atomic percent oxygen, to make it less dense than layer 201. Layer 203 also acts a nucleation layer for the absorber layer 301. The alkali diffusion barrier layer 201 may be in compressive stress and have a thickness greater than that of the second transition metal barrier layer 203. For example, the alkali diffusion barrier layer 201 may have a thickness of around 100 to 400 nm such as 100 to 200 nm, while the second transition metal barrier layer 203 has a thickness of around 50 to 200 nm such as 50 to 100 nm, or may have different thicknesses as discussed herein.

Without wishing to be bounded by a particular theory, the density of the first transition metal layer 202 may be reduced due to a greater interplanar spacing as a result of the lattice distortion. This enhances alkali intercalation (e.g., diffusion) from layer into the CIGS absorber layer 301. In other embodiments, the lattice distortion element may exist as substitutional or interstitial atoms, rather than forming a compound with other impurities or the matrix of the first transition metal layer 202.

The higher density and greater thickness of the alkali diffusion barrier layer 201 substantially reduces or prevents alkali diffusion from the first transition metal layer 202 into the substrate 100. On the other hand, the second transition metal barrier or adhesion layer 203 has a higher porosity than the alkali diffusion barrier layer 201 and permits alkali diffusion from the first transition metal layer 202 into the p-type CIGS semiconductor absorber layer 301. In these embodiments, alkali may diffuse from the first transition metal layer 202, through the lower density second transition metal barrier layer 203, into the at least one p-type semiconductor absorber layer 301 during and/or after the step of depositing the at least one p-type semiconductor absorber layer 301. Alternatively, the alkali diffusion barrier layer 201 and/or optional second transition metal barrier layer 203 may be omitted. When the second transition metal barrier layer 203 is omitted, the at least one p-type semiconductor absorber layer 301 is deposited directly on the first transition metal layer 202, and alkali may diffuse from the first transition metal layer 202 directly into the at least one p-type semiconductor absorber layer 301 during or after the deposition of the at least one p-type semiconductor absorber layer 301.

In one non-limiting configuration, the solar cell comprises a flexible solar cell on a flexible substrate and the solar cell is formed in a shape of roofing shingle, as described in U.S. Published Application Number 2009/0014058 A1, published on Jan. 15, 2009 and incorporated herein by reference in its entirety.

FIG. 3A illustrates a sputtering apparatus that can be used for forming a compound semiconductor layer with a sputtering target. One or more targets comprising copper, indium and gallium, such as a copper-indium-gallium ("CIG") alloy (e.g., targets 27c1 and 27c2) are located in a sputtering process module 22b, such as a vacuum chamber. While two targets are shown in FIG. 3A, 1 to 8 targets may be used (e.g., six targets as shown in FIG. 4). The module 22b may include a pumping device 23 to provide the desired vacuum. Preferably, in one embodiment, all layers shown in FIGS. 1A and 2 are deposited with no vacuum break and care is exercised to maintain a vacuum in the sputtering tool to achieve the high efficiencies with a low minority carrier lifetime. Thus, the first electrode 200, the at least one p-type semiconductor absorber layer 301 containing sublayers 301a-301c, the n-type semiconductor layer 302, and the second electrode 400 are deposited over the substrate 100 by sputtering with no vacuum break as discussed herein.

In this non-limiting example, the targets 27c1 and 27c2 are powered by DC power sources 7. A CIGS layer may be deposited over a substrate 100, such as a moving web substrate, by reactively sputtering the layer from targets 27c1, 27c2 in an atmosphere that comprises a sputtering gas (e.g., argon gas) and a selenium-containing gas, such as evaporated selenium or hydrogen selenide gas.

Alternatively, the sputtering may comprise reactively alternating current (AC) magnetron sputtering the compound semiconductor layer from at least one pair of two conductive targets 27c1 and 27c2, in a sputtering atmosphere that comprises argon gas and a selenium-containing gas. In some embodiments, the conductive targets 27c1 and 27c2 comprise the same target materials. For example, each of the at least two conductive targets 27c1 and 27c2 may comprise a copper, indium and gallium ("CIG") alloy. The sputtering target, for example, may have a composition of about 29-41 wt % copper, including 29-39 wt % Cu, about 36-62 wt % indium, including 49-62 wt % In, and about 8-25 wt % gallium, including 8-16 wt % Ga. In other embodiments, the targets may comprise different materials from each other as will be described below. Radiation heaters 30 maintain the substrate 100 at the required process temperature, for example, around 400-800° C., for example around 500-700° C., which is preferable for the bulk sublayer 301b deposition.

In an embodiment, the sputtering targets 27c1, 27c2 may have a cylindrical shape. The sputtering targets 27c1, 27c2 may be a cylindrical shell formed on a cylindrical sputtering target support (e.g., a backing tube, such as a stainless steel, titanium, aluminum or other non-magnetic backing tube). Alternatively, the targets may comprise a hollow cylinder or hollow rings ring made without the backing tube. The cylinder or rings may be made in a mold or on a temporary support and then attached to the backing tube which houses the magnet(s), as described for example in U.S. application Ser. No. 12/588,578, filed on Oct. 20, 2009, and incorporated herein by reference in its entirety. Alternatively, planar targets may be used instead.

The method may further include steps of forming a first electrode 200 on a substrate 100 below the p-type copper indium gallium selenide absorber layer 301, forming an n-type window semiconductor layer 302 over the p-type copper indium gallium selenide absorber layer 301, and forming a transparent electrode 400 over the n-type window semiconductor layer 302. In an embodiment, a p-n junction is formed between the n-type window semiconductor layer 302 and the p-type copper indium gallium selenide absorber layer 301. In an embodiment of the method, a web substrate may be moved though a plurality of sputtering chambers without a vacuum break. In one aspect of this embodiment, the CIGS layer 301 is formed in one chamber of the plurality of chambers.

Figure 3B:
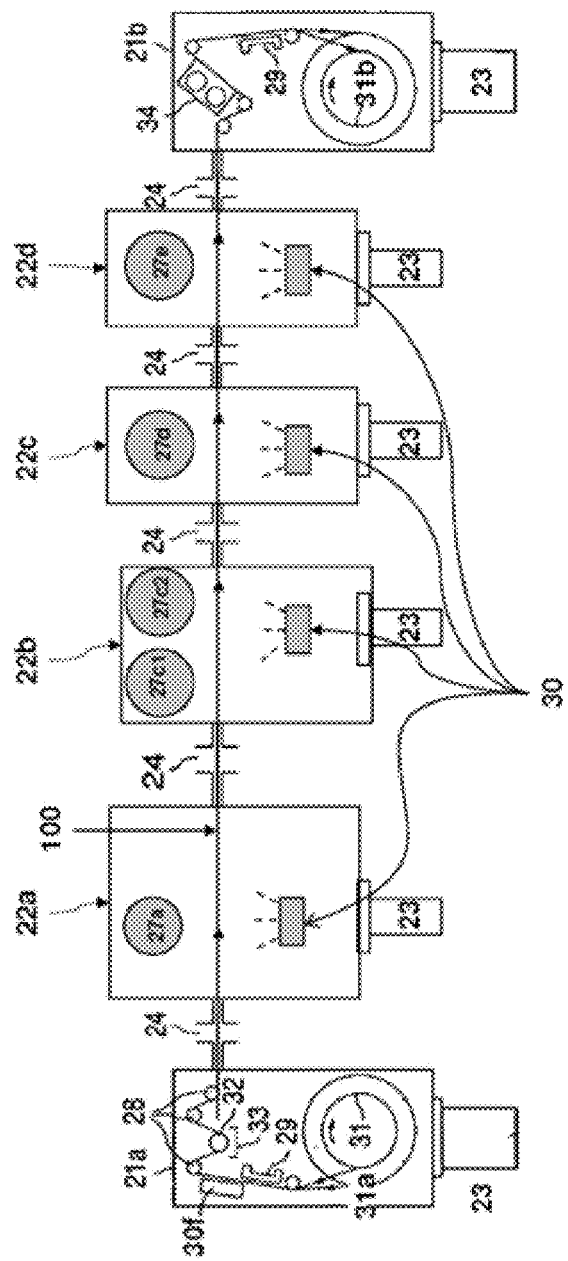
FIG. 3B illustrates a highly simplified schematic diagram of a top view of a modular sputtering apparatus that can be used to manufacture the solar cell depicted in FIG. 2.
Figure 4:
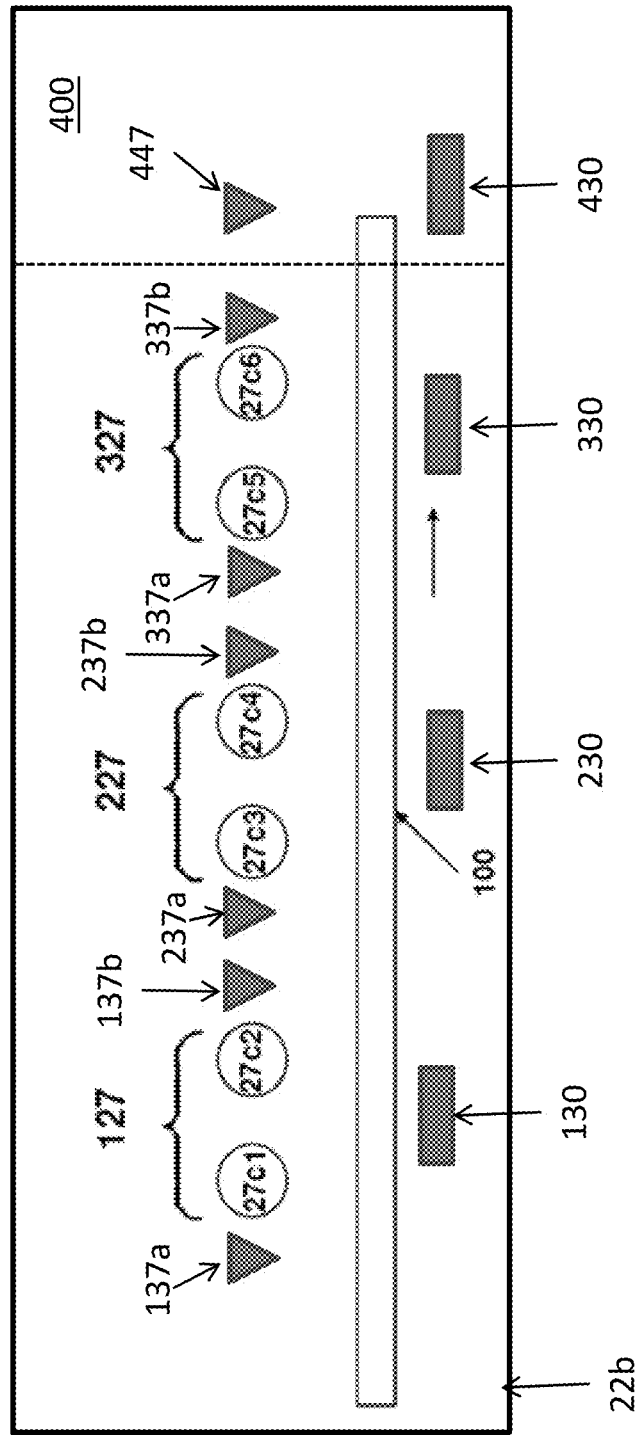
FIG. 4 illustrates schematically the use of three sets of dual magnetrons to increase the deposition rate and grade the composition of the CIGS layer to vary its band gap.

FIG. 3B illustrates a modular sputtering apparatus that may be used for depositing the layers of the photovoltaic device. The apparatus is equipped with an input, or load, module 21a and a symmetrical output, or unload, module 21b. Between the input and output modules are process modules 22a, 22b, 22c and 22d. The number of process modules 22 may be varied to match the requirements of the device that is being produced. Each module has a pumping device 23, such as vacuum pump, for example a high throughput turbomolecular pump, to provide the required vacuum and to handle the flow of process gases during the sputtering operation. Each module may have a number of pumps placed at other locations selected to provide optimum pumping of process gases. The modules are connected together at slit valves 24, which contain very narrow low conductance isolation slots to prevent process gases from mixing between modules. These slots may be separately pumped if required to increase the isolation even further. Other module connectors 24 may also be used. Alternatively, a single large chamber may be internally segregated to effectively provide the module regions, if desired. U.S. Pat. No. 7,544,884 to Hollars, filed on Oct. 25, 2004, which is incorporated herein by reference in its entirety, discloses a vacuum sputtering apparatus having connected modules.

The web substrate 100 is moved throughout the machine by rollers 28, or other devices. Additional guide rollers may be used. Rollers shown in FIG. 3B are schematic and non-limiting examples. Some rollers may be bowed to spread the web, some may move to provide web steering, some may provide web tension feedback to servo controllers, and others may be mere idlers to run the web in desired positions. The input spool 31a and optional output spool 31b thus are actively driven and controlled by feedback signals to keep the web in constant tension throughout the machine. In addition, the input and output modules may each contain a web splicing region or device 29 where the web 100 can be cut and spliced to a leader or trailer section to facilitate loading and unloading of the roll. In some embodiments, the web 100, instead of being rolled up onto output spool 31b, may be sliced into solar modules or cells by the web splicing device 29 in the output module 21b. In these embodiments, the output spool 31b may be omitted. As a non-limiting example, some of the devices/steps may be omitted or replaced by any other suitable devices/steps. For example, bowed rollers and/or steering rollers may be omitted in some embodiments.

Heater arrays 30 are placed in locations where necessary to provide web heating depending upon process requirements. These heaters 30 may be a matrix of high temperature quartz lamps laid out across the width of the web. Infrared sensors provide a feedback signal to servo the lamp power and provide uniform heating across the web. In one embodiment, as shown in FIG. 3, the heaters are placed on one side of the web 100, and sputtering targets 27 a-e are placed on the other side of the web 100. Sputtering targets 27 may be mounted on dual cylindrical rotary magnetron(s), or planar magnetron(s) sputtering sources, or RF sputtering sources.

After being pre-cleaned, the web substrate 100 may first pass by heater array 30f in module 21a, which provides at least enough heat to remove surface adsorbed water. Subsequently, the web can pass over roller 32, which can be a special roller configured as a cylindrical rotary magnetron. This allows the surface of electrically conducting (metallic) webs to be continuously cleaned by DC, AC, or RF sputtering as it passes around the roller/magnetron. The sputtered web material is caught on shield 33, which is periodically changed. Preferably, another roller/magnetron may be added (not shown) to clean the back surface of the web 100. Direct sputter cleaning of a web 100 will cause the same electrical bias to be present on the web throughout the machine, which, depending on the particular process involved, might be undesirable in other sections of the machine. The biasing can be avoided by sputter cleaning with linear ion guns instead of magnetrons, or the cleaning could be accomplished in a separate smaller machine prior to loading into this large roll coater. Also, a corona glow discharge treatment could be performed at this position without introducing an electrical bias.

The substrate 100 may be a foil web, for example, a metal web substrate, a polymer web substrate, or a polymer coated metal web substrate, and may be continuously passing through the sputtering modules during the sputtering process, following the direction of the imaginary arrow along the web 100. Any suitable materials may be used for the foil web. For example, metal (e.g., stainless steel, aluminum, or titanium) or thermally stable polymers (e.g., polyimide or the like) may be used. The foil web 100 may move at a constant or variable rate to enhance deposition.

Next, the web 100 passes into the process module 22a through valve 24. Following the direction of the imaginary arrows along the web 100, the full stack of layers may be deposited in one continuous process. The first electrode 200 may be sputtered in the process module 22a over the web 100, as illustrated in FIG. 3B. Optionally, the process module 22a may include more than one target (e.g., for sputtering barrier and/or adhesion layers). Process module 22a may receive the substrate 100 and may sputter the metal layers of electrode 200, including the molybdenum layer 201, molybdenum oxygen sodium layer 202 ("MoNa layer") and the molybdenum barrier/adhesion layer 203 shown in FIG. 2, as described in U.S. published application 2010/0258191 A1, incorporated herein by reference. Alternatively, two or three submodules may be used to sputter these layers of electrode 200. For example, one or more barrier layers 201 may be sputtered over the front side of the substrate 100 in the process module(s) added between the process modules 21a and 22a. Similarly, one or more process modules (not shown) may be added between the process modules 22a and 22b, to sputter one or more barrier/adhesion layers 203 between the MoNa layer 202 and the CIGS layer 301. Alternatively, the barrier/adhesion layer 203 may be sputtered in the same chamber 22a using a second, different sputtering target from target 27a.

Process module 22b may receive the substrate 10 having the layers 201-203 and then sputter the p-CIGS layer 301. Several submodules may be used to sputter different CIGS sublayers 301a-301c, as shown in FIG. 4 and as will be described in more detail below.

Process module 22c may receive the substrate 100 with the p-CIGS layer 301 and the molybdenum layer 201, the molybdenum oxygen sodium layer 202 and the molybdenum barrier layer 203 shown in FIG. 1A and the n-type semiconductor layer 302 may be deposited via sputtering deposition. Layer 302 may be a CdS, ZnSe or ZnSe layer. Preferably, layer 302 is relatively thin (e.g., less than 50 nm, such as 20-35 nm thick) CdS layer, and may contain some oxygen in addition to cadmium and sulfur.

Process module 22d may receive the substrate 100 with the n-type layer 302, the p-CIGS layer 301, and the molybdenum layer 201, the molybdenum oxygen sodium layer 202 and the molybdenum barrier layer 203 shown in FIG. 2 and the electrode layer(s) 400 (also referred to as a transparent top electrode), is deposited via sputtering deposition over the n-type semiconductor layer 302. The transparent top electrode 400 may comprise multiple transparent conductive layers, for example, but not limited to, one or more of an Indium Tin Oxide (ITO), Zinc Oxide (ZnO) or Aluminum Zinc Oxide (AZO) layers 402 located over an optional resistive Aluminum Zinc Oxide (RAZO) layer 401. Of course, the transparent top electrode 400 may comprise any other suitable materials, for example, doped ZnO or SnO.

Preferably, the sputtering deposition occurs in a continuous fashion. As described above, the first electrode 200, the at least one p-type semiconductor absorber layer 301, the n-type semiconductor layer 302 and the second electrode 400 are deposited over the substrate 100 by sputtering with no vacuum break. More preferably, the steps of depositing the first electrode 200, depositing the at least one p-type semiconductor absorber layer 301, depositing the n-type semiconductor layer 302, and depositing the second electrode 400 comprise sputtering in corresponding process modules of a plurality of independently isolated, connected process modules without breaking vacuum, while passing the web substrate 100 from an input module to an output module through the plurality of independently isolated, connected process modules such that the web substrate continuously extends from the input module to the output module while passing through the plurality of the independently isolated, connected process modules as shown in FIG. 3B. Each of the process modules may include one or more sputtering targets for sputtering material over the web substrate 100.

Optionally, one or more antireflection (AR) films (not shown) may be deposited over the transparent top electrode 400, to optimize the light absorption in the cell, and/or current collection grid lines may be deposited over the top conducting oxide. Any suitable type of sputtering sources may be used, for example, rotating AC magnetrons, RF magnetrons, or planar magnetrons. Extra magnetron stations (not shown), or extra process modules (not shown) could be added for sputtering the optional one or more anti-reflection (AR) layers.

Finally, the web 100 passes into output module 21b, where it is either wound onto the take up spool 31b, or sliced into solar cells using cutting apparatus 29. While sputtering was described as the preferred method for depositing all layers onto the substrate, some layers may be deposited by MBE, CVD, evaporation, plating, etc., while, preferably, the CIS based alloy is reactively sputtered.

Optionally, one or more process modules (not shown) may be added between the process modules 21a and 22a to sputter a back side protective layer over the back side of the substrate 100 before the electrode 200 is deposited on the front side of the substrate. U.S. application Ser. No. 12/379,428 entitled "Protective Layer for Large-Scale Production of Thin-Film Solar Cells" and filed on Feb. 20, 2009, which is hereby incorporated by reference, describes such deposition process.

In one embodiment, the sublayers 301a-301c of p-type semiconductor absorber layer 301 may be sputtered using different targets or target pairs in module 22b. In this embodiment, the process module 22b comprises at least three or more pairs of targets (127, 227, and 327), as illustrated in FIG. 4. The first magnetron pair 127 (target 27c1 and 27c2) is used to sputter the seed sublayer 301a, the middle pair 227 (targets 27c3 and 27c4) located downstream in the substrate movement direction is used to sputter the bulk sublayer 301b and the next pair 327 (targets 27c5 and 27c6) located further down stream in the substrate movement direction is used sputter the top sublayer 301c. The total number of targets pairs may be varied, for example may be 2-10 pairs, such as 3-5 pairs. For example, to make a thicker bulk sublayer 301b, there may be 2 to 4 target pairs 227. Sputtering targets 27 may be cylindrical CIG targets mounted on dual cylindrical rotary AC or DC magnetrons to form target pairs. The cylindrical targets may rotate at 1 to 100 rpm, for example 3 to 70 rpm, including 30 to 60 rpm and 40 to 50 rpm.

One or more selenium sources, such as selenium nozzles connected to selenium evaporators may located adjacent to each target pair. For example, as shown in FIG. 4, selenium nozzles 137a and 137b are located adjacent to the target pair 127, selenium nozzles 237a and 237b are located adjacent to the target pair 227, and selenium nozzles 337a and 337b are located adjacent to the target pair 327. One or more heaters (e.g., 130, 230, 330) may be located adjacent to teach respective target pair. Preferably, the heaters are located on the opposite side of the web substrate 100 from the target pairs.

As described above with respect to FIGS. 1B and 1C, the seed sublayer 301a has a higher ratio of Ga/(Ga+In) than the bulk sublayer 301b. Thus, the first target pair 127 preferably comprises copper-indium-gallium (CIG) sputtering material which has a higher ratio of Ga/(Ga+In) ratio than the CIG sputtering material of the second target pair 227. Furthermore, as described above, the top sublayer 301c has a lower ratio of Cu/(Ga+In) than the seed or bulk sublayers 301a or 301b. Thus, the third target pair 327 preferably comprises copper-indium-gallium (CIG) sputtering material which has a lower ratio of Ga/(Ga+In) ratio than the CIG sputtering material of the first and the second target pairs 127, 227.

For example, the first target pair 127 may include a ratio of Ga/(Ga+In) of greater or equal to 0.4, such as 0.4 to 0.6, and a ratio of Cu/(Ga+In) of 0.75 to 0.9. The second target pair 227 may include ratio of Ga/(Ga+In) of less than or equal to 0.3, such as 0.2 to 0.3, and a ratio of Cu/(Ga+In) of 0.85 to 0.99. The third target pair 327 may include a ratio of Ga/(Ga+In) of 0.25 to 0.35 and a ratio of Cu/(Ga+In) of 0.05 to 0.3. The targets 27c1-27c6 preferably contain a sufficiently high Ga content to form a CIGS layer having a sufficiently high Ga content to achieve a CIGS layer with a band gap of 1.14 eV or higher, such as 1.3 to 1.5 eV.

In another aspect of the first embodiment, the first sublayer 301a may be deposited at a lower temperature than the second sublayer 301b. Thus, the heater element 130 adjacent to the first target pair 127 may be maintained at a lower temperature than the heater element 230 adjacent to the second target pair 227. For example, the heater element 130 adjacent to the first target pair 127 may be maintained at about 450 to 500 C such that the first sublayer 301a may be deposited at a temperature of 450 to 500 C, while the heater element 230 adjacent to the second target pair 227 may be maintained at about 650 to 700 C such that the second sublayer 301b may be deposited at a temperature of 650 to 700 C. The heater element 330 adjacent to the third target pair 327 may be maintained at the same or slightly lower temperature as the heater element 230 adjacent to the second target pair 227.

The resulting p-type semiconductor absorber layer 301 has a majority carrier concentration (i.e., hole concentration) of about $1\times10^{13}$ to about $1\times10^{15}$ cm$^{-3}$, and a conversion efficiency that is at least 13.4 percent, such as at least 15.7 percent average active area with a minority carrier lifetime below 2 nanoseconds and an open circuit voltage that is greater than 550 mV or more particularly, 650-660 mV, as described above.

Alternatively, the solar cell may be formed in reverse order. In this configuration, a transparent electrode 402 is deposited over a substrate, followed by depositing an n-type semiconductor layer 302 over the transparent electrode 402, depositing at least one p-type semiconductor absorber layer 301 over the n-type semiconductor layer 302, and depositing a top electrode 200 comprising an alkali-containing transition metal layer 202 over the at least one p-type semiconductor absorber layer 301. The substrate may be a transparent substrate 100 (e.g., glass) or opaque (e.g., metal). If the substrate 100 used is opaque, then the initial substrate 100 may be delaminated after the steps of depositing the stack of the above described layers, and then bonding a glass or other transparent substrate to the transparent electrode of the stack.

Figure 6:
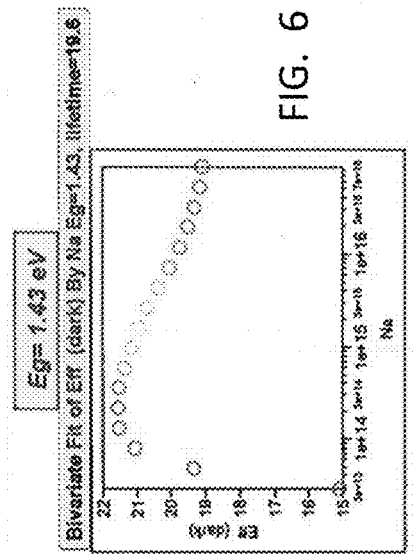
FIGS. 6 and 7 illustrate plots of efficiency versus majority carrier concentration for respective wide and narrow band gap absorbers.
Figure 7:
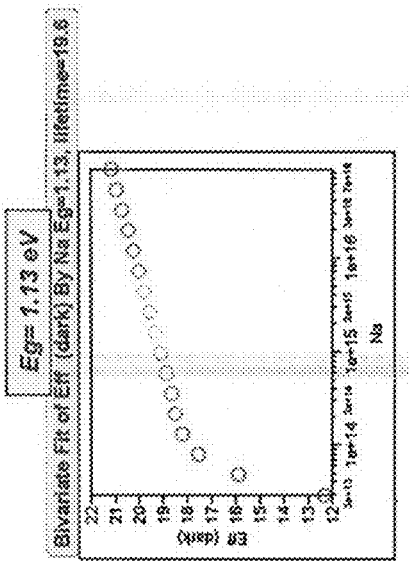
Figure 5:
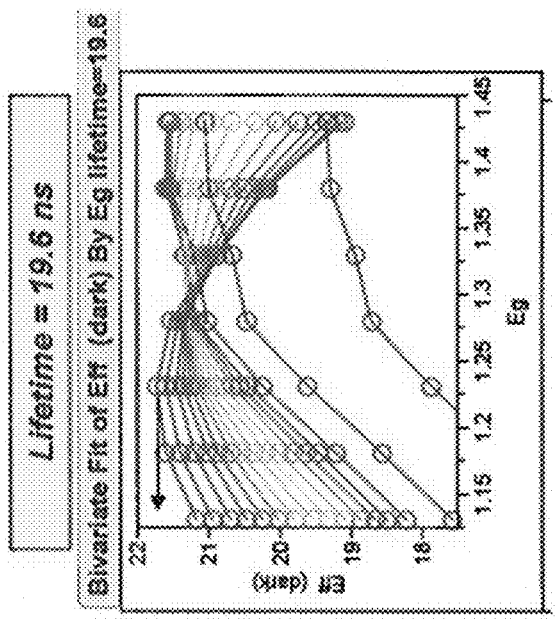
FIG. 5 illustrates a plot of efficiency of a solar cell versus absorber bandgap with a long minority carrier lifetime.

FIG. 5 illustrates a simulation plot of efficiency versus CIGS absorber bandgap in units of eV for a CIGS layer with a relatively long 19.6 ns minority carrier lifetime. FIGS. 6 and 7 illustrate a simulation plot of efficiency versus majority carrier (e.g., hole) concentration in the cell with a long minority carrier lifetime CIGS layer with a wide (1.43 eV) and narrow (1.13 eV) bandgaps, respectively. As illustrated by these Figures, when the minority carrier lifetime is high, an optimum efficiency is not necessarily located at the wide band gap condition. In other words, a wide band gap does not necessarily increase efficiency.

FIG. 8 illustrates a simulation plot of efficiency versus CIGS absorber band gap in units of eV for a CIGS layer with a relatively short 1.6 ns minority carrier lifetime according to the first embodiment of the invention. FIGS. 9 and 10 illustrate a simulation plot of solar cell efficiency versus majority carrier concentration for solar cells containing the short minority carrier lifetime CIGS layer with a wide (1.43 eV) and narrow (1.13 eV) band gaps, respectively. As illustrated by these Figures, when the minority carrier lifetime is low, a higher efficiency results from a wider band gap CIGS layer and a lower majority carrier concentration of the CIGS layer (e.g., around between 1 and $3\times10^{14}$ cm$^{-3}$, for example around $2\times10^{14}$ cm$^{-3}$). In other words, a wide CIGS band gap (e.g., above 1.4 eV) improves device efficiency. Thus, the device efficiency may be improved by increasing the CIGS layer bandgap by tailoring the metal element ratios as described above (i.e., increasing the Ga content in the top sublayer 301c to increase the CIGS band gap in the top sublayer 301c adjacent to the p-n junction with layer 302), and optimizing the majority (e.g., hole) carrier concentration by optimizing the sodium doping concentration in the CIGS layer.

The sodium concentration in the CIGS layer may be optimized by the thickness and/or porosity of the MoNa layer 202 and/or the thickness and/or porosity of the adhesion layer 203. A thicker and/or more porous MoNa layer 202 and/or a thinner and/or more porous adhesion layer 203 increase the Na concentration in the CIGS layer 301, while thinner and/or less porous MoNa layer 202 and/or a thicker and/or less porous adhesion layer 203 decrease the Na concentration in the CIGS layer 301. The porosity of the metal layers 202, 203 may be controlled by the pressure in the sputtering chamber (the higher the pressure, the higher the porosity). The thickness of the metal layers 202, 203 may be controlled by the sputtering power in the sputtering chamber (the higher the power, the thicker the layer). Thus, it may not be necessary to maximize the sodium doping concentration and the majority carrier concentration in the CIGS absorber layer to achieve an optimum device efficiency.

Thus, as described above, a solar cell may be manufactured with a high efficiency despite an extremely short carrier lifetime. For example, the simulation in FIG. 8 shows a minority carrier lifetime of 1.6 nanoseconds with an efficiency that is over 16 percent for a wide band gap (i.e., above 1.14 eV, such as between 1.3 and 1.5 eV), while FIG. 9 shows that when majority carrier concentration is optimized for the wide band gap CIGS layer (e.g., between 1 and $3\times10^{14}$ cm$^{-3}$), the efficiency may be increased to at least 18 percent.

Without wishing to be bound by a particular theory, it is believed that a low minority carrier lifetime may increase recombination in the depletion width. One way to overcome this is by increasing an electric field, reducing the time spent in the depletion region, as shown by the formulas below:

Depletion width recombination currents that contribute to diode Voc $$J_{re} = \int_0^{W_D} qUdx = \sqrt{\frac{\pi}{2}\frac{kTn_i}{\tau E_D}} \exp\left(\frac{qV}{2kT}\right)$$

$$E_0 = \sqrt{\frac{qN(2\phi_{E-V})}{e_s}} \leftarrow \text{Electric field at the point of maximum recombination in the depletion region}$$

The electric field can be increased by optimizing the majority carrier concentration by optimizing the dopant (e.g., Na) concentration in CIGS layer. Specifically, the Na concentration should be optimized in the depletion region (e.g., at the p-n junction including the top sublayer 301c and possibly an upper portion of the bulk sublayer 301b depending on the depletion region width). The optimized Na concentration in the depletion region provides an optimized majority carrier concentration in the depletion region.

In a second embodiment of the invention, the method of manufacturing a solar cell may also control a ratio of an amount of selenium in the sputtering atmosphere to an amount of metal in the sputtering atmosphere to vary the selenium to metal ratio in the sublayers 301a-301c of the p-type CIGS semiconductor absorber layer 301. Likewise, the substrate temperature of during the deposition of the sublayers 301a-301c may be varied as described above.

The method includes reactively sputtering at least one p-type CIGS absorber layer 301 in a selenium atmosphere from a plurality of CIG target pairs 127-327 described above with respect to FIG. 4. The sputtering method and apparatus described above with respect to FIGS. 3A and 3B may be used. As used herein, the term ratio of selenium to metal means a ratio of selenium to one of Cu, Ga or In metal in the sputtering atmosphere, depending on which metal has the highest peak as measured in the sputtering atmosphere by optical emission spectroscopy (OES). For example, a 0.5 OES ratio of Se peak to highest metal peak corresponds to a Se to metal atomic ratio of 2. Likewise, OES ratios of 1 and 2 correspond to atomic ratios of 4 and 8, respectively.

Figure 11:
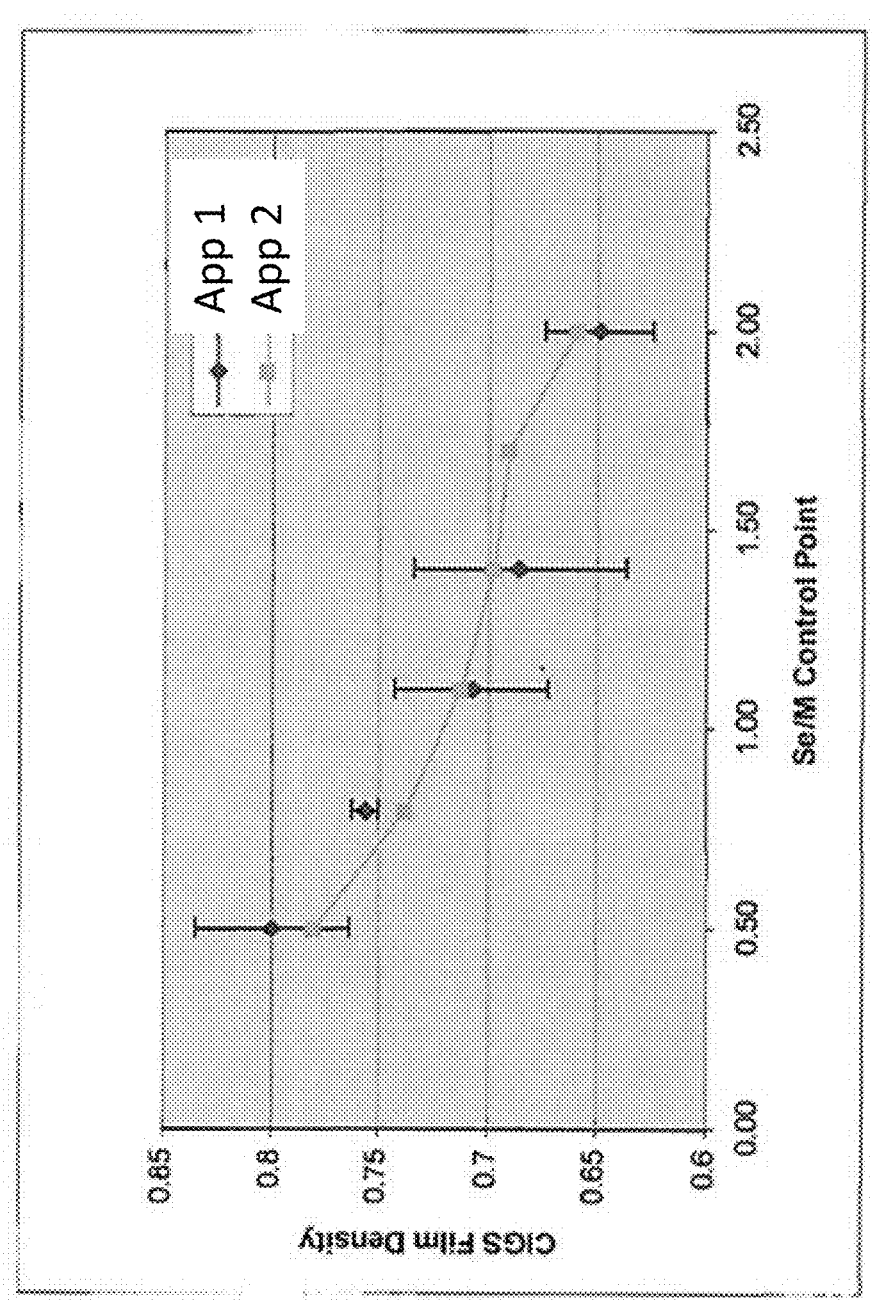
FIG. 11 illustrates a plot of sublayer density versus ratio of selenium to metal in the sputtering atmosphere.

FIG. 11 illustrates a plot of a selenium to metal OES ratio (x-axis) versus a CIGS layer density (y-axis). The plotted curve illustrates that the CIGS density increases with a decreasing selenium to metal ratio. The experiments were repeated on two different sputtering apparatuses, as shown by the square and rhombus symbols. Thus, the bulk sublayer 301b and the top sublayer 301c are preferably deposited at a relatively low Se to metal ratio (e.g., an OES ratio of 1 or less, such as 0.25 to 1, or an atomic ratio of 4 or less, such as 2 or less, for example 1 to 1.6) to increase the density of these sublayers. A denser CIGS absorber or at least a denser bulk portion of the absorber decreases cohesive fracture of the CIGS absorber.

However, the inventors realized that forming the CIGS absorber 301 with a lower Se to metal ratio during reactive sputtering has a negative impact on adhesion of the absorber 301 to the underlying electrode 200. Therefore, in one aspect of the second embodiment of the invention, the atomic ratio of selenium to metal is intentionally made higher during deposition of the seed sublayer 301a than during deposition of the bulk sublayer 301b. The seed sublayer 301a is also deposited at a lower temperature than the bulk sublayer 301b. This increases the adhesion of the CIGS absorber 301 to the underlying electrode 200 and improves the solar cell efficiency.

Figure 12:
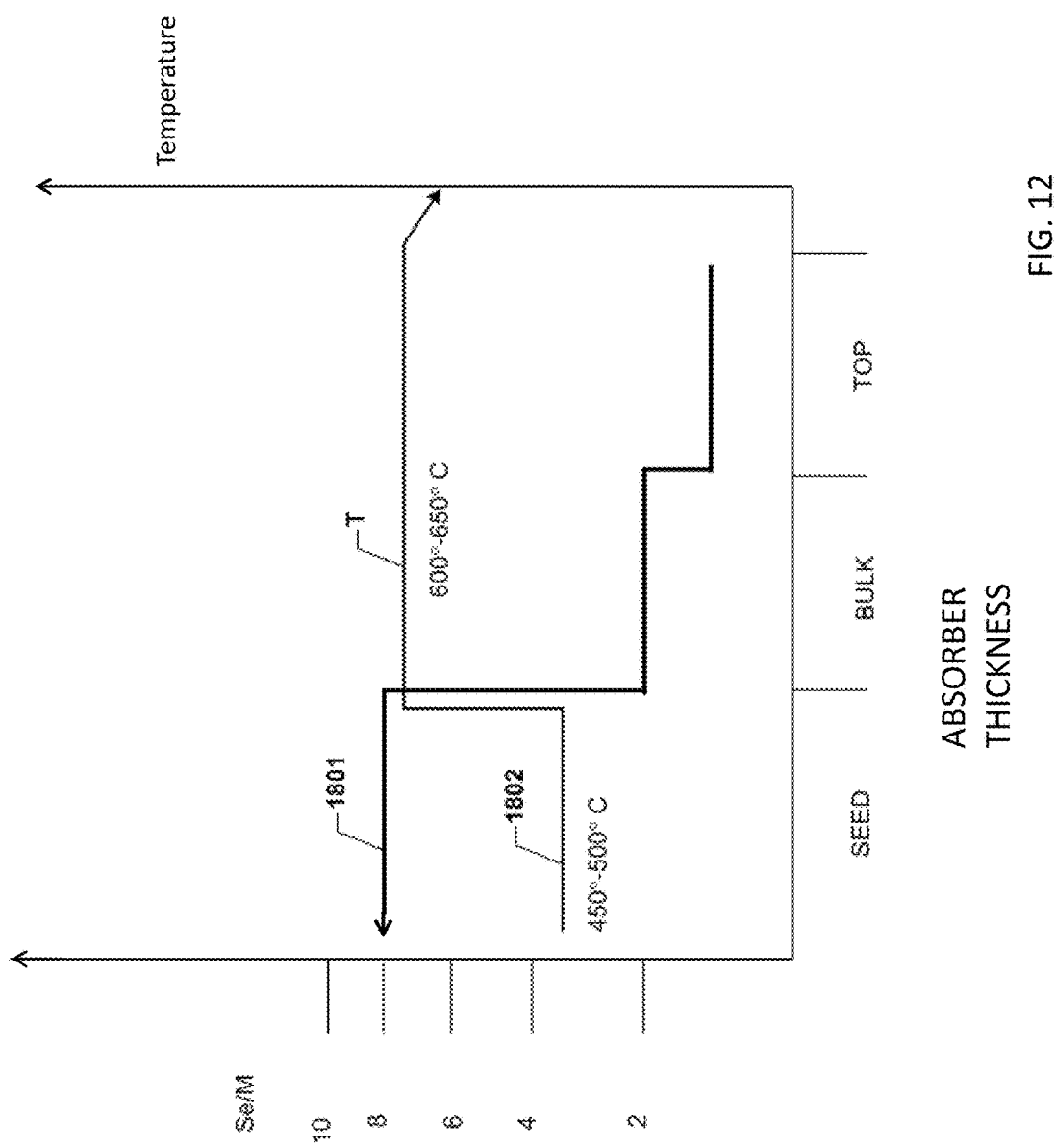
FIG. 12 illustrates a plot of a ratio of selenium to metal in a sputtering atmosphere and temperature in the seed, bulk and top absorber sublayers.

FIG. 12 illustrates a plot of a selenium to metal atomic ratio (left y-axis) and temperature (right y-axis) versus CIGS layer 301 thickness (x-axis), from the seed layer 301a to the bulk layer 301b and to the top layer 301c. During reactive sputtering of the seed layer 301a, the selenium to metal atomic ratio is above 5 (e.g., 6-10, for example about 8) and the temperature is in a range of 450 to 500 degrees Celsius. During the reactive sputtering of the bulk sublayer 301b, the selenium to metal atomic ratio drops from above 4 to below 4 (e.g., 1 to 3, for example about 2) while the substrate temperature increases to about 600 to 650 degrees Celsius. During the reactive sputtering of the top sublayer 301c, the selenium to metal atomic ratio is maintained or reduced further to 1 to 1.6 while the temperature is maintained at about 600 to 650 degrees Celsius. The higher deposition temperature of sublayers 301b and 301c promotes sodium diffusion from the MoNa layer 202 into these sublayers 301b and 301c during the sublayer 301b and 301c deposition. This results in a more uniform sodium distribution in the absorber (e.g., a higher sodium content and a higher majority carrier concentration in the upper portion of the absorber 301 near the p-n junction), while leads to an improved solar cell efficiency.

Figure 13:
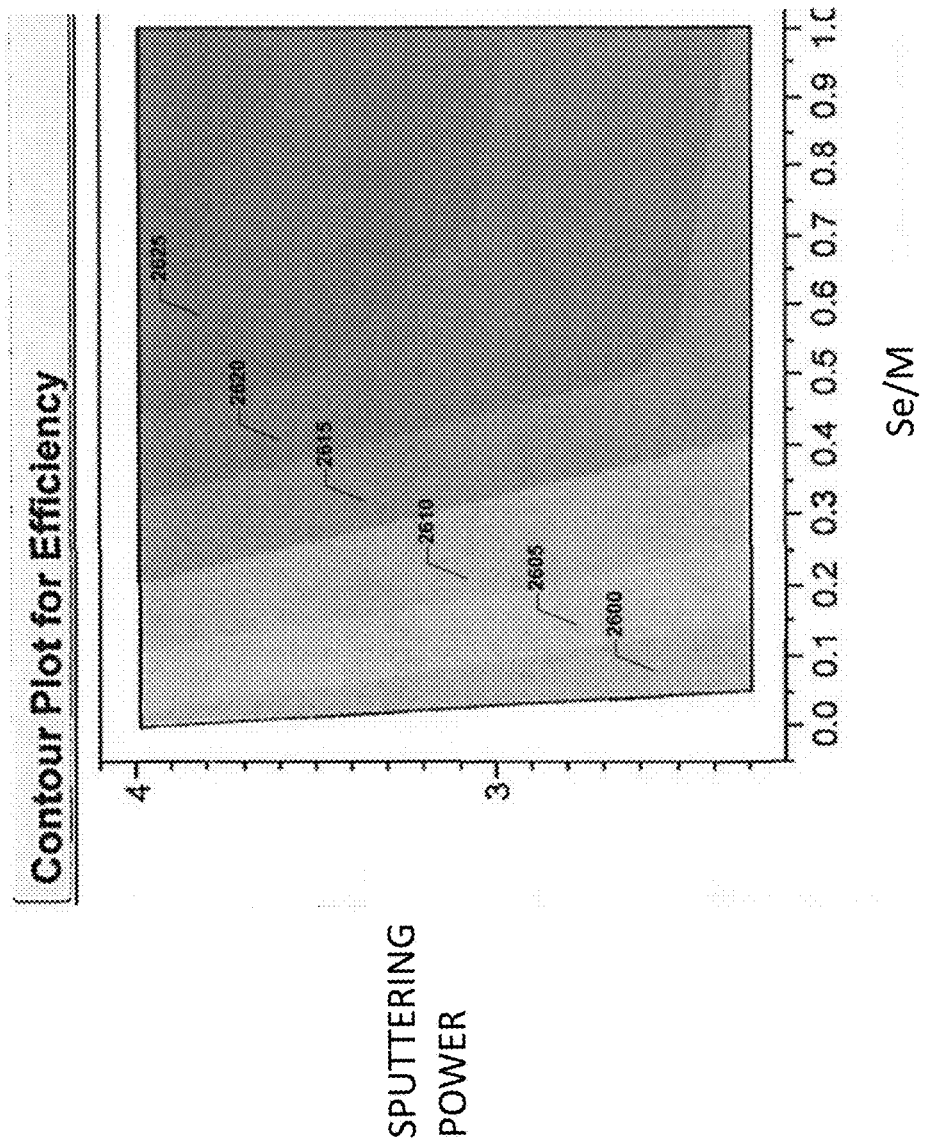
FIG. 13 illustrates contour plot sputtering power versus a ratio of selenium to metal in the sputtering atmosphere during top sublayer sputtering and its effect on efficiency.

FIG. 13 illustrates a contour plot of film thickness (which is a function of the normalized sputtering power shown on the y-axis) versus selenium to metal ratio (x-axis) of the top sublayer 301c. The bands 2600-2625 illustrate a number of different efficiency values. A first efficiency band 2600 value is less than or equal to 12.650. A second efficiency band 2605 value is less than or equal to 12.475. A third efficiency band 2610 value is greater than or equal to 12.3. A fourth efficiency band 2615 value is greater than or equal to 12.125. A fifth efficiency band 2620 value is greater than or equal to 11.950. A sixth efficiency band 2625 value is greater than or equal to 11.775.

As shown in FIG. 13, the efficiency increases with a lower Se to metal ratio in the top sublayer 301c and with a decreasing top sublayer thickness. Thus, it is preferred to keep the Se to metal atomic ratio in the top sublayer below 2, such as 1 to 1.6, and to minimize the thickness of the top sublayer to 0.2 microns or less, such as 0.15 to 0.2 microns. Preferably, the top sublayer 301c is formed with the lowest Se to metal ratio and the top sublayer 301c is the thinnest of the three sublayers (e.g., sublayer 301c makes up less than 10%, such as 1-6%, of the total CIGS absorber 301 thickness).

If desired, the adhesion layer 203 of the lower electrode 200 may be made thinner and/or the MoNa layer 202 of the lower electrode may be made thicker and/or more porous as described above to improve adhesion of the CIGS absorber 301 to the lower electrode 200 and to increase sodium diffusion from the MoNa layer 202 through the adhesion layer 203 into the CIGS absorber 301 during the absorber deposition.

If desired, the adhesion layer 203 may be eliminated, since the absorber 301 adheres better to the porous, oxygen containing MoNa layer 202 than to less porous Mo layer 203. However, this may decrease the control of sodium diffusion from the MoNa layer 202 into the absorber 301

(e.g., most of the sodium diffuses into the bottom portion of the absorber resulting in a sodium deficiency in the top of the absorber near the p-n junction) and thus negatively impact the solar cell efficiency.

In another aspect of the second embodiment, the method may include that a post deposition selenization anneal of the top sublayer 301c to improve the solar cell efficiency. The post deposition selenization anneal of the top sublayer 301c may be performed while the substrate 100 moves through the end portion 400 of the sputtering chamber 22b beyond the third target pair 327, as shown in FIG. 4. Thus, the end portion 400 of the chamber 22b contains a selenium source (e.g., one or more Se nozzles 447) to provide a selenium atmosphere and one or more heaters 430 but no metal targets. Thus, no additional metal is sputtered in this portion 400 of the chamber 22b, and the as-deposited top sublayer 301c is exposed to a selenium ambient at an elevated temperature (e.g., 300 to 600 C) generated by the heater 430 away from at least one sputtering target 27c6 in a sputtering chamber 22b in which the top sublayer 301c was deposited. The end portion 400 may be separated from the rest of the chamber 22b by a wall or a baffle (as shown by the dashed line) or it may not be separated physically from the rest of the chamber 22b.

Furthermore, as described in the first embodiment above and as illustrated in FIGS. 1B and 1C, the seed sublayer 301a may include a ratio of Ga/(Ga+In) of 0.4 to 0.6, and may include a ratio of Cu/(Ga+In) of 0.75 to 0.9. The bulk sublayer 301b may include a ratio of Ga/(Ga+In) of 0.2 to 0.3, and a ratio of Cu/(Ga+In) of 0.85 to 0.99. The top sublayer 301c may include a ratio of Ga/(Ga+In) of 0.25 to 0.35, and a ratio of Cu/(Ga+In) of 0.05 to 0.3. This optimizes the adhesion of the absorber 301 to the underlying electrode and improves the solar cell efficiency.

The sublayers 301a-301c may have any suitable density. In one aspect of the first and the second embodiments, the seed sublayer 301a has the highest density (i.e., over 90% dense and less than 10% voids) of the three sublayers. Without wishing to be bound by a particular theory, it is believed that the seed sublayer 301a has the highest density due to its lower temperature deposition than sublayers 301b and 301c (see FIG. 12) and/or because sublayer 301 is nucleated on a metal or metal alloy electrode 200 (e.g., molybdenum layer 203). The bulk sublayer 301b may have a relatively high density (e.g., over 80% dense), but lower than the density of the seed sublayer 301a. The top sublayer 301c may have a high density (e.g., over 90%) such that it is higher than that of the bulk sublayer but lower than that of the seed sublayer. The layer density may be controlled by the sputtering pressure in the appropriate portion of the sputtering chamber 22b.

In summary, the sublayers 301a-301c may have one or more of the following characteristics. The seed sublayer 301a is formed at the lowest temperature of about 450 to 500 C and the highest Se to metal ratio of any sublayer. The seed sublayer has an intermediate copper content and the highest gallium content of the three sublayers. The seed sublayer may have the highest density and an intermediate thickness compared to the other sublayers.

The bulk sublayer 301b is formed at a higher temperature and a lower Se to metal ratio than the seed sublayer 301a. The bulk sublayer has the highest copper content and the lowest gallium content of the three sublayers. The bulk sublayer may have the lowest density and the highest thickness compared to the other sublayers.

The top sublayer 301c is formed at a higher temperature than the seed sublayer and at the lowest Se to metal ratio of any sublayer. The top sublayer has the lowest copper content and an intermediate gallium content of the three sublayers. The top sublayer may have the intermediate density and the lowest thickness compared to the other sublayers.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A solar cell comprising:
a substrate;
a first electrode located over the substrate;
at least one copper indium gallium selenide p-type semiconductor absorber layer containing sodium;
an n-type semiconductor layer located over the p-type semiconductor layer; and
a second electrode located over the n-type semiconductor layer, wherein the solar cell has a conversion efficiency that is at least 13.4 percent average active area with a minority carrier lifetime below 2 nanoseconds,
wherein:
the p-type semiconductor absorber layer is formed with a graded composition employing steps of forming a first copper indium gallium selenide sublayer adjacent to the first electrode, forming a second copper indium gallium selenide sublayer over the first sublayer, and forming a third copper indium gallium selenide sublayer over the second sublayer and adjacent to the n-type semiconductor layer;
the first sublayer is formed with a higher ratio of Ga/(Ga+In) than the second sublayer;
the first sublayer is formed with a ratio of Ga/(Ga+In) of 0.4 to 0.6, and a ratio of Cu/(Ga+In) of 0.75 to 0.9;
the second sublayer is formed with a ratio of Ga/(Ga+In) of 0.2 to 0.3, and a ratio of Cu/(Ga+In) of 0.85 to 0.99; and
the third sublayer is formed with a ratio of Ga/(Ga+In) of 0.25 to 0.35, and a ratio of Cu/(Ga+In) between 0.05 and 0.3.

2. The solar cell of claim 1, wherein:
the solar cell is located in a module; and
the module has an active area greater than or equal to 1 m$^2$ and a conversion efficiency greater than or equal to 15.7 percent average active area.

3. The solar cell of claim 2, wherein the module has a conversion efficiency of 15.7 to 16.1 percent average active area and the minority carrier lifetime of 1.6 nanoseconds or less.

4. The solar cell of claim 1, wherein the solar cell has an active area of ¼ cm$^2$ to ½ cm$^2$ and a conversion efficiency greater than or equal to 14.4 percent average active area.

5. The solar cell of claim 4, wherein the solar cell has the conversion efficiency of 16.6 to 18.1 percent average active area.

6. The solar cell of claim 1, wherein the solar cell has an open circuit voltage that is greater than 550 mV.

7. The solar cell of claim 6, wherein the solar cell has an open circuit voltage of at least 650 mV.

8. The solar cell of claim 1, wherein the solar cell has a minority carrier lifetime of less than 1 nanosecond.

9. The solar cell of claim 8, wherein the solar cell has a minority carrier lifetime of 0.3 to 0.8 nanoseconds.

10. The solar cell of claim 1, wherein the first electrode comprises a first transition metal layer which comprises a sodium and oxygen containing molybdenum layer.

11. The solar cell of claim 10, wherein sodium diffuses from the first transition metal layer into the p-type semiconductor absorber layer during the step of depositing the p-type semiconductor absorber layer, and wherein the first transition metal layer comprises at least 59 atomic percent molybdenum, 5 to 40 atomic percent oxygen and 0.01 to 1.5 atomic percent sodium.

12. The solar cell of claim 11, wherein:
the first electrode further comprises a molybdenum barrier layer located over the first transition metal layer;
the molybdenum barrier layer is substantially free of oxygen and has a higher density than the first transition metal layer; and
sodium diffuses from the first transition metal layer through the molybdenum barrier layer into the p-type semiconductor absorber layer during the step of reactively sputtering the p-type semiconductor absorber layer.

13. The solar cell of claim 10, wherein the p-type semiconductor absorber layer has a band gap of 1.14 eV or higher.

14. The solar cell of claim 13, wherein the p-type semiconductor absorber layer has a band gap in a range of 1.3 to 1.5 eV, and wherein the p-type semiconductor absorber layer has a majority carrier concentration of about $1 \times 10^{13}$ to about $1 \times 10^{15}$ cm$^{-3}$.

15. The solar cell of claim 1, wherein the solar cell comprises a flexible solar cell on a flexible substrate and the solar cell is formed in a shape of roofing shingle.

16. A solar cell comprising:
a substrate;
a first electrode located over the substrate;
at least one copper indium gallium selenide p-type semiconductor absorber layer containing sodium;
an n-type semiconductor layer located over the p-type semiconductor layer; and
a second electrode located over the n-type semiconductor layer;
wherein:
the solar cell has a conversion efficiency that is at least 13.4 percent average active area with a minority carrier lifetime below 2 nanoseconds;
the solar cell has an open circuit voltage that is greater than 550 mV;
the first electrode comprises a first transition metal layer which comprises a sodium and oxygen containing molybdenum layer;
sodium diffuses from the first transition metal layer into the p-type semiconductor absorber layer during the step of depositing the p-type semiconductor absorber layer;
the p-type semiconductor absorber layer has a band gap of 1.14 eV or higher;
the p-type semiconductor absorber layer has a graded composition as a function of thickness and a majority carrier concentration of about $1 \times 10^{13}$ to about $1 \times 10^{15}$ cm$^{-3}$;
the graded composition p-type semiconductor absorber layer comprises a first copper indium gallium selenide sublayer adjacent to the first electrode, a second copper indium gallium selenide sublayer over the first sublayer, and a third copper indium gallium selenide sublayer over the second sublayer and adjacent to the n-type semiconductor layer;
the first sublayer is formed with a higher ratio of Ga/(Ga+In) than the second sublayer; and
the third sublayer is formed with a lower ratio of Cu/(Ga+In) than the first and the second sublayers;
the first sublayer is formed with a ratio of Ga/(Ga+In) of 0.4 to 0.6, and a ratio of Cu/(Ga+In) of 0.75 to 0.9;
the second sublayer is formed with a ratio of Ga/(Ga+In) of 0.2 to 0.3, and a ratio of Cu/(Ga+In) of 0.85 to 0.99; and
the third sublayer is formed with a ratio of Ga/(Ga+In) of 0.25 to 0.35, and a ratio of Cu/(Ga+In) between 0.05 and 0.3.

17. The solar cell of claim 16, wherein:
the solar cell is located in a module;
the module has an active area greater than or equal to 1 m$^2$;
the module has a conversion efficiency of 15.7 to 16.1 percent average active area;
the solar cell has an open circuit voltage of 650-660 mV;
the first transition metal layer comprises at least 59 atomic percent molybdenum, 5 to 40 atomic percent oxygen and 0.01 to 1.5 atomic percent sodium;
the first electrode further comprises a molybdenum barrier layer located over the first transition metal layer;
the molybdenum barrier layer is substantially free of oxygen and has a higher density than the first transition metal layer; and
sodium diffuses from the first transition metal layer through the molybdenum barrier layer into the p-type semiconductor absorber layer during the step of reactively sputtering the p-type semiconductor absorber layer; and
the p-type semiconductor absorber layer has a band gap in a range of 1.3 to 1.5 eV.

* * * * *